United States Patent
Nozawa et al.

(10) Patent No.: US 11,333,966 B2
(45) Date of Patent: May 17, 2022

(54) MASK BLANK, PHASE SHIFT MASK, AND METHOD OF MANUFACTURING SEMICONDUCTOR DEVICE

(71) Applicant: HOYA CORPORATION, Tokyo (JP)

(72) Inventors: Osamu Nozawa, Tokyo (JP); Yasutaka Horigome, Tokyo (JP); Hitoshi Maeda, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 106 days.

(21) Appl. No.: 16/755,117

(22) PCT Filed: Nov. 20, 2018

(86) PCT No.: PCT/JP2018/042813
§ 371 (c)(1),
(2) Date: Apr. 9, 2020

(87) PCT Pub. No.: WO2019/102990
PCT Pub. Date: May 31, 2019

(65) Prior Publication Data
US 2021/0364909 A1    Nov. 25, 2021

(30) Foreign Application Priority Data
Nov. 24, 2017    (JP) .............................. JP2017-225528

(51) Int. Cl.
*G03F 1/32*    (2012.01)
(52) U.S. Cl.
CPC ...................................... *G03F 1/32* (2013.01)
(58) Field of Classification Search
CPC ..... G03F 1/26; G03F 1/28; G03F 1/29; G03F 1/30; G03F 1/32; G03F 1/34
USPC .......................................................... 430/5
See application file for complete search history.

(56) References Cited

U.S. PATENT DOCUMENTS

| | | | |
|---|---|---|---|
| 5,514,499 A | 5/1996 | Iwamatsu et al. | |
| 6,569,577 B1 | 5/2003 | Isao et al. | |
| 2004/0023125 A1 | 2/2004 | Nozawa et al. | |
| 2012/0153323 A1* | 6/2012 | Hawryluk | H01L 33/22 257/98 |
| 2015/0125785 A1 | 5/2015 | Inazuki et al. | |
| 2015/0227040 A1 | 8/2015 | Ha | |
| 2016/0291456 A1 | 10/2016 | Kosaka et al. | |
| 2018/0143528 A1 | 5/2018 | Nozawa et al. | |

FOREIGN PATENT DOCUMENTS

| | | |
|---|---|---|
| JP | H07134392 | 5/1995 |
| JP | 2004062135 | 2/2004 |
| JP | 2011095787 | 5/2011 |
| JP | 2014145920 | 8/2014 |
| JP | 2015111246 | 6/2015 |
| JP | 2015152924 | 8/2015 |
| JP | 2016191882 | 11/2016 |
| KR | 20170044110 A | 4/2017 |

OTHER PUBLICATIONS

PCT/JP2018/042813, "English Translation of International Search Report", dated Jan. 8, 2019, 2 pages.
KR 10-2020-7013285, "Notification of Reasons for Refusal" with Machine Translation, dated Feb. 14, 2022, 20 pages.

* cited by examiner

*Primary Examiner* — Christopher G Young
(74) *Attorney, Agent, or Firm* — Kilpatrick Townsend & Stockton LLP

(57) ABSTRACT

Provided is a mask blank including a phase shift film. The phase shift film is made of a material containing a non-metallic element and silicon and includes first, second, and third layers; refractive indexes $n_1$, $n_2$, and $n_3$ of the first, second, and third layers, respectively, at the wavelength of an exposure light satisfy the relations of $n_1 < n_2$ and $n_2 > n_3$; and extinction coefficients $k_1$, $k_2$, and $k_3$ of the first, second, and third layers, respectively, at the wavelength of an exposure light satisfy the relation of $k_1 > k_2 > k_3$.

27 Claims, 2 Drawing Sheets

[FIG. 1]
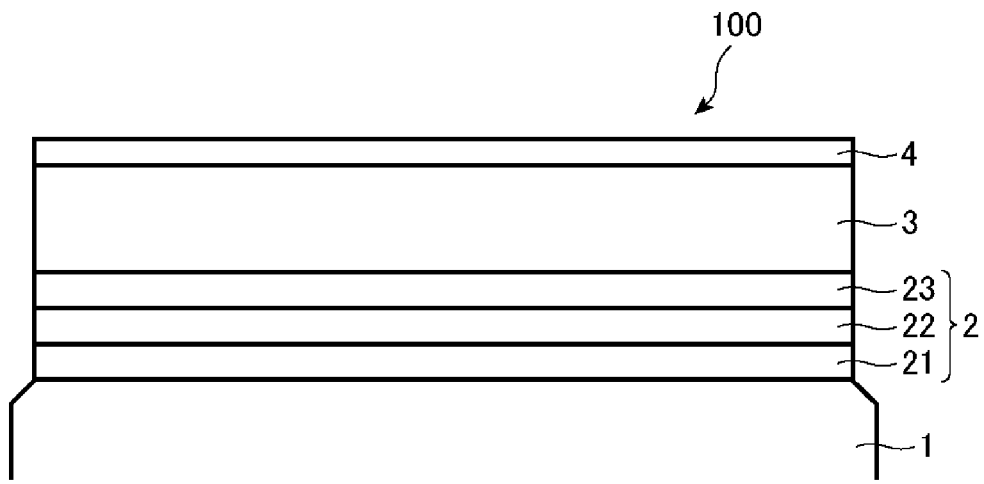
[FIG. 2]
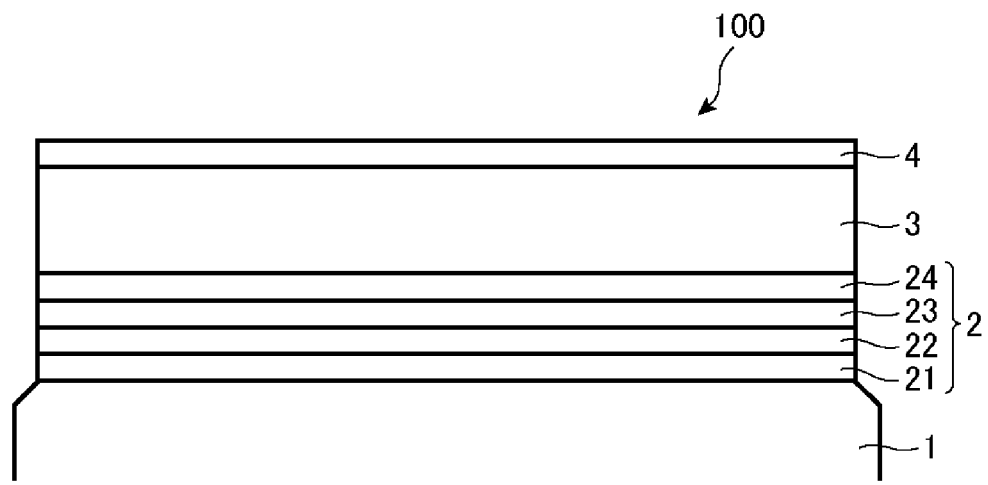

ic device. Proposed in Patent
MASK BLANK, PHASE SHIFT MASK, AND METHOD OF MANUFACTURING SEMICONDUCTOR DEVICE

CROSS-REFERENCE TO RELATED APPLICATIONS

This application is a National Stage of International Application No. PCT/JP2018/042813, filed Nov. 20, 2018, which claims priority to Japanese Patent Application No. 2017-225528, filed on Nov. 24, 2017, and the contents of which is incorporated by reference in its entirety.

TECHNICAL FIELD

This disclosure relates to a mask blank and a phase shift mask manufactured using the mask blank. This disclosure further relates to a method of manufacturing a semiconductor device using the phase shift mask.

BACKGROUND ART

Generally, in a manufacturing process of a semiconductor device, photolithography is used to form a fine pattern. Multiple substrates called transfer masks are usually utilized in forming the fine pattern. In order to miniaturize a pattern of a semiconductor device, in addition to miniaturization of a mask pattern formed on a transfer mask, it is necessary to shorten a wavelength of an exposure light source used in photolithography. Shortening of wavelength has been advancing recently from the use of KrF excimer laser (wavelength 248 nm) to ArF excimer laser (wavelength 193 nm) as an exposure light source in the manufacture of a semiconductor device.

As for the types of transfer masks, a half tone phase shift mask is known in addition to a conventional binary mask having a light shielding pattern made of a chromium-based material on a transparent substrate. A molybdenum silicide (MoSi)-based material is widely used for a phase shift film of a half tone phase shift mask.

In recent years, studies have been conducted to apply Si-based materials such as SiN and SiON having high ArF light fastness to phase shift films. Si-based materials tend to have low light shielding properties compared to MoSi-based materials, and it was relatively difficult to apply them to phase shift films having transmittance of less than 10% that are conventionally widely used. On the contrary, Si-based materials can be applied easily to phase shift films having relatively high transmittance of 10% or more (Patent Document 1).

On the other hand, when a phase shift mask of a half tone phase shift mask was set on an exposure apparatus and irradiated with an ArF exposure light, there was a problem of position displacement of a pattern of the phase shift film. The problem is caused by an ArF exposure light absorbed within the pattern of the phase shift film transforming into thermal energy, and the heat is transmitted to the transparent substrate to cause thermal expansion (Patent Document 2).

PRIOR ART PUBLICATIONS

Patent Documents

Patent Document 1
Japanese Patent Application Publication 2015-111246
Patent Document 2
Japanese Patent Application Publication 2015-152924

SUMMARY OF THE DISCLOSURE

Problems to be Solved by the Disclosure

A phase shift film of a half tone phase shift mask (hereafter simply referred to as phase shift mask) should have a function to transmit an exposure light at a predetermined transmittance and also a function to generate a predetermined phase difference between the exposure light transmitted through the phase shift film and the exposure light transmitted through the air for a same distance as a thickness of the phase shift film. Recently, further miniaturization of semiconductor devices is in progress, and application of exposure technologies such as multiple patterning techniques is under way. There is increasing demand for precision in stacking each transfer mask of a set of transfer masks used in manufacturing one semiconductor device. Therefore, in the case of a phase shift mask as well, there is a growing demand for preventing thermal expansion of a phase shift film pattern (phase shift pattern) to prevent displacement of the phase shift pattern caused thereby.

In Patent Document 2, a back surface reflectance of a thin film pattern when a photomask is set on an exposure apparatus and irradiated with an exposure light from a transparent substrate side (reflectance on the transparent substrate side) is set to be higher than conventional cases. An attempt is made, by setting the back surface reflectance higher than conventional cases, to reduce heat generated by transformation of light energy of an exposure light absorbed by a thin film, and suppressing occurrence of position displacement of the thin film pattern associated with thermal expansion of the transparent substrate. Proposed in Patent Document 2 as a mask blank for manufacturing a binary mask is a structure where a highly reflective material layer and a light shielding layer are stacked in this order on a transparent substrate. Further proposed as a mask blank for manufacturing a phase shift mask is a structure where a highly reflective material layer and a phase shifting layer are stacked in this order on a transparent substrate.

In the case of a mask blank for manufacturing a binary mask, the stacked structure of the highly reflective material layer and the light shielding layer requires predetermined light shielding properties. This is not difficult. On the other hand, in the case of a mask blank for manufacturing a phase shift mask, in addition to the stacked structure of the highly reflective material layer and the phase shifting layer having a function to transmit an exposure light at a predetermined transmittance, it is also required to have a function to generate a predetermined phase difference between the transmitting exposure light and the exposure light transmitted through the air for a same distance as a thickness of the stacked structure. Feasible variation is limited in a phase shift film with a design concept to ensure a predetermined back surface reflectance with a highly reflective material layer alone. Particularly, in the case of a study of a phase shift film with a relatively high transmittance (e.g., 15% or more) under the design concept relying on a highly reflective material layer, reduction of a back surface reflectance is inevitable when a predetermined transmittance and a predetermined phase difference are to be applied to the stacked structure of the highly reflective material layer and the phase shifting layer, causing difficulty in suppressing position displacement of the phase shift pattern.

This disclosure was made to solve a conventional problem. The aspect of the disclosure is to provide a mask blank having a phase shift film on a transparent substrate, the phase shift film having a function to transmit an ArF exposure light at a predetermined transmittance and also a function to generate a predetermined phase difference to the transmitting ArF exposure light, the phase shift film suppressing thermal expansion of the phase shift film pattern (phase shift pattern), and which can suppress displacement of the phase shift pattern caused thereby. A further aspect is to provide a phase shift mask manufactured using this mask blank. Yet another aspect of this disclosure is to provide a method of manufacturing a semiconductor device using such a phase shift mask.

Means for Solving the Problem

For solving the above problem, this disclosure includes the following configurations.
(Configuration 1)
A mask blank including a phase shift film on a transparent substrate, in which:
the phase shift film has a function to transmit an exposure light of an ArF excimer laser at a transmittance of 15% or more, and a function to generate a phase difference of 150 degrees or more and 200 degrees or less between the exposure light transmitted through the phase shift film and the exposure light transmitted through air for a same distance as a thickness of the phase shift film,
the phase shift film is made of a material containing a non-metallic element and silicon,
the phase shift film has a structure where a first layer, a second layer, and a third layer are stacked in this order from a side of the transparent substrate,
the first layer is provided in contact with a surface of the transparent substrate,
refractive indexes $n_1$, $n_2$, and $n_3$ of the first layer, the second layer, and the third layer, respectively, at a wavelength of the exposure light satisfy relations of $n_1 < n_2$ and $n_2 > n_3$, and
extinction coefficients $k_1$, $k_2$, and $k_3$ of the first layer, the second layer, and the third layer, respectively, at a wavelength of the exposure light satisfy a relation of $k_1 > k_2 > k_3$.
(Configuration 2)
The mask blank according to Configuration 1, in which the first layer has the refractive index $n_1$ of less than 2.0, and the extinction coefficient $k_1$ of 1.0 or more.
(Configuration 3)
The mask blank according to Configuration 1 or 2, in which the first layer has a thickness of 10 nm or less.
(Configuration 4)
The mask blank according to any one of Configurations 1 to 3, in which the second layer has the refractive index $n_2$ of 2.3 or more and the extinction coefficient $k_2$ of 0.5 or less.
(Configuration 5)
The mask blank according to any one of Configurations 1 to 4, in which the third layer has the refractive index $n_3$ of less than 2.3 and the extinction coefficient $k_3$ of 0.15 or less.
(Configuration 6)
The mask blank according to any one of Configurations 1 to 5, in which the phase shift film is made of a material consisting of a non-metallic element and silicon, or a material consisting of a metalloid element, a non-metallic element, and silicon.
(Configuration 7)
The mask blank according to any one of Configurations 1 to 6, in which the first, the second, and the third layers are all made of a material containing nitrogen.

(Configuration 8)
The mask blank according to any one of Configurations 1 to 7, in which the third layer is made of a material containing oxygen.
(Configuration 9)
The mask blank according to any one of Configurations 1 to 8, in which:
the phase shift film includes a fourth layer on the third layer,
a refractive index $n_4$ of the fourth layer at a wavelength of the exposure light satisfies relations of $n_1 < n_4$ and $n_3 < n_4$, and
an extinction coefficient $k_4$ of the fourth layer at an wavelength of the exposure light satisfies relations of $k_1 > k_4$ and $k_3 < k_4$.
(Configuration 10)
The mask blank according to Configuration 9, in which the refractive index $n_4$ of the fourth layer is 2.3 or more and the extinction coefficient $k_4$ is 0.5 or less.
(Configuration 11)
The mask blank according to Configuration 9 or 10, in which the fourth layer is made of a material containing nitrogen.
(Configuration 12)
The mask blank according to any one of Configurations 1 to 11 including a light shielding film on the phase shift film.
(Configuration 13)
A phase shift mask including a phase shift film having a transfer pattern on a transparent substrate, in which:
the phase shift film has a function to transmit an exposure light of an ArF excimer laser at a transmittance of 15% or more, and a function to generate a phase difference of 150 degrees or more and 200 degrees or less between the exposure light transmitted through the phase shift film and the exposure light transmitted through air for a same distance as a thickness of the phase shift film,
the phase shift film is made of a material containing a non-metallic element and silicon,
the phase shift film has a structure where a first layer, a second layer, and a third layer are stacked in this order from a side of the transparent substrate,
the first layer is provided in contact with a surface of the transparent substrate,
refractive indexes $n_1$, $n_2$, and $n_3$ of the first layer, the second layer, and the third layer, respectively, at a wavelength of the exposure light satisfy relations of $n_1 < n_2$ and $n_2 > n_3$, and
extinction coefficients $k_1$, $k_2$, and $k_3$ of the first layer, the second layer, and the third layer, respectively, at a wavelength of the exposure light satisfy a relation of $k_1 > k_2 > k_3$.
(Configuration 14)
The phase shift mask according to Configuration 13, in which the first layer has the refractive index $n_1$ of less than 2.0 and the extinction coefficient $k_1$ of 1.0 or more.
(Configuration 15)
The phase shift mask according to Configuration 13 or 14, in which the first layer has a thickness of 10 nm or less.
(Configuration 16)
The phase shift mask according to any one of Configurations 13 to 15, in which the second layer has the refractive index $n_2$ of 2.3 or more and the extinction coefficient $k_2$ of 0.5 or less.
(Configuration 17)
The phase shift mask according to any one of Configurations 13 to 16, in which the third layer has the refractive index $n_3$ of less than 2.3 and the extinction coefficient $k_3$ of 0.15 or less.

(Configuration 18)

The phase shift mask according to any one of Configurations 13 to 17, in which the phase shift film is made of a material consisting of a non-metallic element and silicon, or a material consisting of a metalloid element, a non-metallic element, and silicon.

(Configuration 19)

The phase shift mask according to any one of Configurations 13 to 18, in which the first layer, the second layer, and the third layer are all made of a material containing nitrogen.

(Configuration 20)

The phase shift mask according to any one of Configurations 13 to 19, in which the third layer is made of a material containing oxygen.

(Configuration 21)

The phase shift mask according to any one of Configurations 13 to 20, in which:

the phase shift film includes a fourth layer on the third layer, a refractive index $n_4$ of the fourth layer at a wavelength of the exposure light satisfies relations of $n_1 < n_4$ and $n_3 < n_4$, and an extinction coefficient $k_4$ of the fourth layer at an wavelength of the exposure light satisfies relations of $k_1 > k_4$ and $k_3 < k_4$.

(Configuration 22)

The phase shift mask according to Configuration 21, in which the fourth layer has the refractive index $n_4$ of 2.3 or more and the extinction coefficient $k_4$ of 0.5 or less.

(Configuration 23)

The phase shift mask according to Configuration 21 or 22, in which the fourth layer is made of a material containing nitrogen.

(Configuration 24)

The phase shift mask according to any one of Configurations 13 to 23 including a light shielding film having a pattern including a light shielding band on the phase shift film.

(Configuration 25)

A method of manufacturing a phase shift mask using the mask blank according to Configuration 12, including:

forming a transfer pattern in the light shielding film by dry etching;

forming a transfer pattern in the phase shift film by dry etching with a light shielding film having the transfer pattern as a mask; and forming a pattern including a light shielding band in the light shielding film by dry etching with a resist film having a pattern including a light shielding band as a mask.

(Configuration 26)

A method of manufacturing a semiconductor device including using the phase shift mask according to Configuration 24 and subjecting a resist film on a semiconductor substrate to exposure-transfer of a transfer pattern.

(Configuration 27)

A method of manufacturing a semiconductor device including using the phase shift mask manufactured by the method of manufacturing the phase shift mask according to Configuration 25 and subjecting a resist film on a semiconductor substrate to exposure-transfer of a transfer pattern.

Effect of the Disclosure

The mask blank of this disclosure includes a phase shift film on a transparent substrate, the phase shift film having a function of transmitting ArF exposure light at a predetermined transmittance and also a function of generating a predetermined phase difference to the transmitting ArF exposure light, the phase shift film suppressing thermal expansion of the phase shift film pattern (phase shift pattern), and can suppress displacement of the phase shift pattern caused thereby.

BRIEF DESCRIPTION OF THE DRAWINGS

FIG. 1 is a cross-sectional view showing a configuration of a mask blank of the first embodiment of this disclosure.

FIG. 2 is a cross-sectional view showing a configuration of a mask blank according to the second and third embodiments of this disclosure.

EMBODIMENTS FOR CARRYING OUT THE DISCLOSURE

Figure 3A:
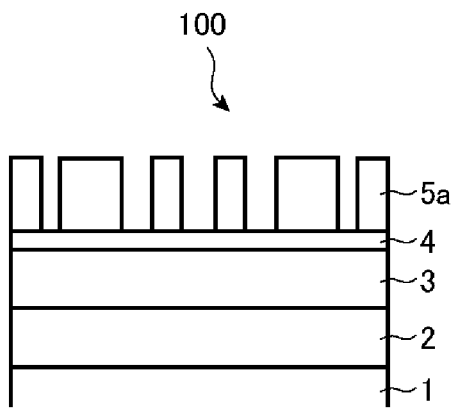
FIGS. 3A-3G are schematic cross-sectional views showing a manufacturing process of the phase shift mask according to the first to third embodiments of this disclosure.
Figure 3E:
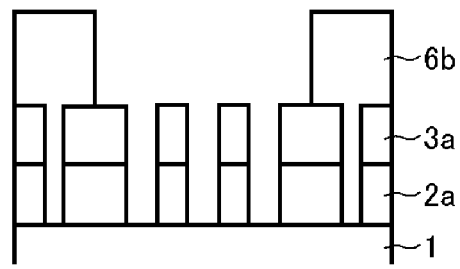

The embodiments of this disclosure are explained below. The inventors of this application diligently studied a phase shift film regarding means that can suppress position displacement of a pattern associated with thermal expansion, while having both of a function for transmitting an ArF exposure light at a predetermined transmittance and a function for generating a predetermined phase difference.

To suppress position displacement of a pattern associated with thermal expansion, it will be necessary to suppress an ArF exposure light from being transformed into thermal energy within the phase shift film. The inventors of this application obtained knowledge that temperature elevation of a phase shift film is approximately proportional to a square of the ratio of an ArF exposure light absorbed within the phase shift film (absorptivity Abs of ArF exposure light). Based on this knowledge, the inventors found out that reducing an absorptivity Abs of an ArF exposure light down to 55% or less is important for suppressing transformation into thermal energy in the phase shift film within a tolerable range mentioned above. An absorptivity Abs of an ArF exposure light, a transmittance T, and a back surface reflectance BAR satisfy the relation of "Abs[%]=100[%]−(transmittance T[%]+back surface reflectance BAR[%])". Therefore, to satisfy a predetermined transmittance T and an absorptivity Abs of 55% or less, it will be important to increase a back surface reflectance BAR to a certain extent.

To increase a back surface reflectance of a phase shift film provided on a transparent substrate, it is necessary to form at least a layer of the phase shift film in contact with the transparent substrate from a material having a high extinction coefficient k at an exposure light wavelength. Due to the necessity to fulfill desired optical properties and film thickness, a phase shift film of a single layer structure is commonly made of a material with a high refractive index n and a low extinction coefficient k. Consideration is made herein on increasing a back surface reflectance of a phase shift film by adjusting the composition of a material for making the phase shift film and significantly increasing an extinction coefficient k. Since the adjustment precludes the phase shift film from satisfying the condition of a transmittance of a predetermined range, it will be necessary to significantly reduce the thickness of the phase shift film. On the other hand, however, reduction of thickness of the phase shift film will preclude the phase shift film from satisfying the condition of the phase difference of a predetermined range. Since there is a limitation in increasing a refractive index n of a material making a phase shift film, it is difficult to increase a back surface reflectance with a phase shift film of a single layer structure. In the case of a phase shift film with a relatively high transmittance T of 15% or more, it is particularly difficult to increase a back surface reflectance with a phase shift film of a single layer structure.

On the other hand, in the case of a phase shift film of a two layer structure, while an adjustment is possible to increase a back surface reflectance while satisfying the conditions of a transmittance of a predetermined range and a phase difference of a predetermined range, design freedom is not as high. Particularly in the case of applying a two layer structure to achieve a phase shift film having optical properties of a predetermined phase difference (150 degrees or more and 200 degrees or less) and 15% or more transmittance that are enough to obtain a sufficient phase shifting effect, it is difficult to increase a back surface reflectance and it is difficult to render an absorptivity Abs of 55% or less. The inventors diligently studied the possibility of simultaneously satisfying the above conditions in the case of a phase shift film consisting of a silicon-based material (material containing non-metallic element and silicon) and having a stacked structure of three or more layers. In the case of a phase shift film with a stacked structure of three or more layers as mentioned above, not only is an adjustment possible to increase a back surface reflectance while satisfying the conditions of a transmittance of a predetermined range and a phase difference of a predetermined range, but design freedom is high as well.

As a result, the inventors discovered that in a phase shift film having a configuration where a first layer, which is a layer in contact with a substrate, has stacked thereon a second layer and a third layer in this order, a refractive index n and an extinction coefficient k of each of the three layers satisfying predetermined relations can simultaneously fulfill the above conditions. Concretely, the inventors discovered that a phase shift film simultaneously satisfying three conditions of a predetermined phase difference (150 degrees or more and 200 degrees or less), a transmittance of 15% or more, and an absorptivity Abs of 55% or less can be achieved by a phase shift film having a first layer, a second layer, and a third layer, where refractive indexes $n_1$, $n_2$, and $n_3$ of the first, second, and third layers, respectively, at the wavelength of an ArF exposure light satisfy the two relations of $n_1 < n_2$ and $n_2 > n_3$; and further, extinction coefficients $k_1$, $k_2$, and $k_3$ of the first, second, and third layers, respectively, at the wavelength of an ArF exposure light satisfy the relation of $k_1 > k_2 > k_3$.

Further, the inventors found out that a phase shift film simultaneously satisfying the three conditions of a predetermined phase difference (150 degrees or more and 200 degrees or less), a transmittance of 15% or more, and an absorptivity Abs of 55% or less can be achieved by a phase shift film having a first layer, a second layer, a third layer, and a fourth layer, with the third layer having the fourth layer thereon and with the above conditions on the first, second, and third layers satisfied, and where a refractive index $n_4$ of the fourth layer at the wavelength of an ArF exposure light satisfies relations of $n_1 < n_4$ and $n_3 < n_4$; and an extinction coefficient $k_4$ of the fourth layer at the wavelength of an ArF exposure light satisfies the relations of $k_1 > k_4$ and $k_3 < k_4$.

First Embodiment

FIG. 1 is a cross-sectional view showing a configuration of a mask blank 100 of the first embodiment of this disclosure. The mask blank 100 of this disclosure shown in FIG. 1 has a structure where a phase shift film 2, a light shielding film 3, and a hard mask film 4 are stacked in this order on a transparent substrate 1.

The transparent substrate 1 can be made of quartz glass, aluminosilicate glass, soda-lime glass, low thermal expansion glass ($SiO_2$—$TiO_2$ glass, etc.), etc., in addition to synthetic quartz glass. Among the above, synthetic quartz glass is particularly preferable as a material for making the transparent substrate 1 of the mask blank for having a high transmittance to an ArF excimer laser light. A refractive index n of the material making the transparent substrate 1 to an ArF exposure light wavelength (about 193 nm) is preferably 1.5 or more and 1.6 or less, more preferably 1.52 or more and 1.59 or less, and even more preferably 1.54 or more and 1.58 or less.

A transmittance of the phase shift film 2 to an ArF exposure light is preferably 15% or more. Since the phase shift film of the first embodiment has high design freedom, an adjustment is possible to increase a back surface reflectance while satisfying the condition of phase difference of a predetermined range, even if a transmittance is 15% or more. A transmittance of the phase shift film 2 to an exposure light is preferably 16% or more, and more preferably 17% or more. On the other hand, as a transmittance of the phase shift film to an exposure light increases, it will be more difficult to increase a back surface reflectance. Therefore, a transmittance of the phase shift film 2 to an exposure light is preferably 40% or less, and more preferably 35% or less.

To obtain a proper phase shifting effect, it is desired for the phase shift film 2 to be adjusted such that a phase difference that generates between the transmitting ArF exposure light and the light that transmitted through the air for the same distance as a thickness of the phase shift film 2 is within the range of 150 degrees or more and 200 degrees or less. The phase difference of the phase shift film 2 is preferably 155 degrees or more, and more preferably 160 degrees or more. On the other hand, the phase difference of the phase shift film 2 is preferably 195 degrees or less, and more preferably 190 degrees or less.

On the viewpoint of reducing the ratio of an ArF exposure light entered within the phase shift film 2 from being transformed into heat, the phase shift film 2 is desired to have a reflectance of the transparent substrate 1 side (back surface side) to an ArF exposure light (back surface reflectance) of at least 25% or more in the state where only the phase shift film 2 is present on the transparent substrate 1. The state where only the phase shift film 2 is present on the transparent substrate 1 indicates a state where a light shielding pattern 3b is not stacked on a phase shift pattern 2a (region of phase shift pattern 2a where light shielding pattern 3b is not stacked) when a phase shift mask 200 (see FIG. 3G) was manufactured from this mask blank 100. On the other hand, a back surface reflectance being too high is not preferable in the state where only the phase shift film 2 is present, since greater influence will be imparted on an exposure transfer image by a reflected light of the back surface side of the phase shift film 2 when the phase shift mask 200 manufactured from this mask blank 100 was used to exposure-transfer an object to be transferred (resist film on semiconductor wafer, etc.). On this viewpoint, a back surface reflectance of the phase shift film 2 to an ArF exposure light is preferably 45% or less.

The phase shift film 2 of this embodiment has a structure where a first layer 21, a second layer 22, and a third layer 23 are stacked from the transparent substrate 1 side. It is required to at least satisfy each condition of the transmittance, the phase difference, and the back surface reflectance given above in the entire phase shift film 2. To satisfy the above conditions, the phase shift film 2 of this embodiment is configured such that refractive indexes $n_1$, $n_2$, and $n_3$ of the first layer 21, the second layer 22, and the third layer 23, respectively, at the wavelength of an ArF exposure light satisfy the relations of $n_1 < n_2$ and $n_2 > n_3$; and extinction coefficients $k_1$, $k_2$, and $k_3$ of the first layer 21, the second layer 22, and the third layer 23, respectively, at the wavelength of an ArF exposure light satisfy the relation of $k_1 > k_2 > k_3$. Incidentally, it is further preferable that the phase shift film 2 is configured to satisfy the relation of $n_1 < n_3 < n_2$.

A refractive index $n_1$ of the first layer 21 is preferably less than 2.0, and more preferably 1.95 or less. A refractive index $n_1$ of the first layer 21 is preferably 0.95 or more, and more preferably 1.0 or more. An extinction coefficient $k_1$ of the first layer 21 is preferably 1.0 or more, and more preferably 1.2 or more. Further, an extinction coefficient $k_1$ of the first layer 21 is preferably 3.0 or less, and more preferably 2.8 or less. A refractive index $n_1$ and an extinction coefficient $k_1$ of the first layer 21 are values derived by regarding the entire first layer 21 as a single, optically uniform layer.

A refractive index $n_2$ of the second layer 22 is preferably 2.3 or more, and more preferably 2.4 or more. Further, a refractive index $n_2$ of the second layer 22 is preferably 3.0 or less, and more preferably 2.8 or less. An extinction coefficient $k_2$ of the second layer 22 is preferably 0.5 or less, and more preferably 0.4 or less. Further, an extinction coefficient $k_2$ of the second layer 22 is preferably 0.16 or more, and more preferably 0.2 or more. A refractive index $n_2$ and an extinction coefficient $k_2$ of the second layer 22 are values derived by regarding the entire second layer 22 as a single, optically uniform layer.

Further, a refractive index $n_3$ of the third layer 23 is preferably less than 2.3, and more preferably 2.2 or less. Further, a refractive index $n_3$ of the third layer 23 is preferably 1.8 or more, and more preferably 2.0 or more. An extinction coefficient $k_3$ of the third layer 23 is preferably 0.15 or less, and more preferably 0.14 or less. Further, an extinction coefficient $k_3$ of the third layer 23 is preferably 0.00 or more, and more preferably 0.02 or more. A refractive index $n_3$ and an extinction coefficient $k_3$ of the third layer 23 are values derived by regarding the entire third layer 23 as a single, optically uniform layer.

A refractive index n and an extinction coefficient k of a thin film including the phase shift film 2 are not determined only by the composition of the thin film. Film density and crystal condition of the thin film are also the factors that affect a refractive index n and an extinction coefficient k. Therefore, the conditions in forming a thin film by reactive sputtering are adjusted so that the thin film reaches desired refractive index n and extinction coefficient k. For allowing the first layer 21, the second layer 22, and the third layer 23 to have a refractive index n and an extinction coefficient k of the above range, not only the ratio of mixed gas of noble gas and reactive gas (oxygen gas, nitrogen gas, etc.) is adjusted in forming a film by reactive sputtering, but various other adjustments are made upon forming a film by reactive sputtering, such as pressure in a film forming chamber, power applied to the sputtering target, and positional relationship such as distance between a target and the transparent substrate 1. These film forming conditions are specific to film forming apparatuses, and are adjusted arbitrarily for the first layer 21, the second layer 22, and the third layer 23 to be formed to achieve desired refractive index n and extinction coefficient k.

The phase shift film 2 (first layer 21, second layer 22, third layer 23) is made of a material containing a non-metallic element and silicon. A thin film made of a material containing silicon and a transition metal tends to have a higher extinction coefficient k. To reduce the entire film thickness of the phase shift film 2, the phase shift film 2 can be made of a material containing a non-metallic element, silicon, and a transition metal. The transition metal to be included in this case includes one metal among molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), palladium (Pd), etc., or an alloy of these metals. On the other hand, the phase shift film 2 is preferably made of a material consisting of a non-metallic element and silicon, or a material consisting of a metalloid element, a non-metallic element, and silicon. It is preferable not to include a transition metal when the phase shift film 2 requires high light fastness to an ArF exposure light. Further, in this case, it is preferable not to include metal elements excluding transition metals, since their possibility of causing reduction of light fastness to an ArF exposure light cannot be denied.

In the case of including a metalloid element in the phase shift film 2, it is preferable to include one or more metalloid elements selected from boron, germanium, antimony, and tellurium, since enhancement in conductivity of silicon to be used as a sputtering target can be expected.

In the case of including a non-metallic element in the phase shift film 2, it is preferable to include one or more non-metallic elements selected from nitrogen, carbon, fluorine, and hydrogen. These non-metallic elements include noble gas such as helium (He), argon (Ar), krypton (Kr), and xenon (Xe). Further, all of the first layer 21, the second layer 22, and the third layer 23 of the phase shift film 2 are preferably made of a material containing nitrogen. Generally, compared to a thin film made without nitrogen, a thin film made of the same material as the thin film and including nitrogen tends to have a greater refractive index n. The higher a refractive index n of any of the first layer 21, the second layer 22, and the third layer 23 of the phase shift film 2, reduction can be made in the entire film thickness required to ensure a predetermined phase difference required on the phase shift film 2. Further, oxidation of pattern side wall is suppressed when a phase shift pattern is formed by including nitrogen in any of the first layer 21, the second layer 22, and the third layer 23 of the phase shift film 2.

The first layer 21 is formed in contact with a surface of the transparent substrate 1. This is because a configuration where the first layer 21 contacts the surface of the transparent substrate 1 can obtain greater effect of enhancing a back surface reflectance that is generated by the stacked structure of the first layer 21, the second layer 22, and the third layer 23 of the phase shift film 2.

It is desirable that the thickness of the first layer 21 is as small as possible within the scope capable of satisfying the conditions of a predetermined transmittance, a phase difference, and a back surface reflectance required for the phase shift film 2. The thickness of the first layer 21 is preferably 10 nm or less, more preferably 8 nm or less, and even more preferably 6 nm or less. Further, particularly considering a back surface reflectance of the phase shift film 2, the thickness of the first layer 21 is preferably 1 nm or more, and more preferably 2 nm or more.

It is preferable not to positively include oxygen in the first layer 21 (oxygen content through composition analysis of X-ray photoelectron spectroscopy, etc. is preferably 3 atom % or less, more preferably detection lower limit or less).

This is for the purpose of preventing significant reduction of a back surface reflectance of the phase shift film 2, since reduction of an extinction coefficient $k_1$ of the first layer 21 caused by including oxygen in the material forming the first layer 21 is greater compared to other non-metallic elements.

The first layer 21 is preferably made of a material containing nitrogen as mentioned above. By including nitrogen in the first layer 21, it will be possible to reduce the difference between other layers (second layer 22, third layer 23) forming the phase shift film 2 in etching rate to dry etching carried out in patterning the phase shift film 2. Thus, generation of step difference in the cross-sectional shape of the phase shift film 2 after patterning can be suppressed. A nitrogen content of the material forming the first layer 21 is preferably 5 atom % or more, more preferably 10 atom % or more, and even more preferably 15 atom % or more. However, as a nitrogen content of the material forming the first layer 21 increases, a refractive index $n_1$ becomes greater and an extinction coefficient $k_1$ becomes lower. Therefore, a nitrogen content of the material forming the first layer 21 is preferably 30 atom % or less, more preferably 25 atom % or less, and even more preferably 20 atom % or less.

As mentioned above, a refractive index $n_2$ of the second layer 22 is required to be greater than a refractive index $n_1$ of the first layer 21 ($n_1 < n_2$), and an extinction coefficient $k_2$ of the second layer 22 to be less than an extinction coefficient $k_1$ of the first layer ($k_1 > k_2$). Therefore, a nitrogen content of the material forming the second layer 22 is preferably more than a nitrogen content of the material forming the first layer 21, preferably 40 atom % or more, more preferably 45 atom % or more, and even more preferably 50 atom % or more. However, a nitrogen content of the material forming the second layer 22 is preferably 57 atom % or less. Including a nitrogen content more than a nitrogen content of a stoichiometrically stable $Si_3N_4$ (about 57 atom %) causes easier escaping of nitrogen from the second layer 22 through, for example, mask cleaning and heat generating in the second layer 22 during dry etching, so that a nitrogen content tends to be reduced.

It is preferable not to positively include oxygen in the second layer 22, similar as the first layer 21 (oxygen content through composition analysis of X-ray photoelectron spectroscopy, etc. is preferably 3 atom % or less, more preferably detection lower limit or less).

The second layer 22 has an intermediate extinction coefficient k among the three layers forming the phase shift film 2. When the second layer 22 is too thick, it is necessary to reduce the thickness of the first layer in order to achieve a predetermined transmittance with the entire phase shift film 2, and thus, there is a risk that a back surface reflectance of the phase shift film 2 is reduced. Thus, the thickness of the second layer 22 is preferably 50 nm or less, more preferably 48 nm or less, and even more preferably 46 nm or less. Further, since the second layer 22 has the highest refractive index n among each layer forming the phase shift film 2, a certain degree or more thickness is required to increase a back surface reflectance of the phase shift film 2. Thus, the thickness of the second layer 22 is preferably 10 nm or more, and more preferably 15 nm or more.

The third layer 23 is preferably made of a material containing oxygen. Further, the third layer 23 is preferably made of a material consisting of silicon, nitrogen, and oxygen, or a material consisting of silicon, nitrogen, oxygen, and one or more elements selected from a non-metallic element and a metalloid element. By including nitrogen in the third layer 23, it will be possible to reduce the difference between other layers (first layer 21, second layer 22) forming the phase shift film 2 in etching rate to dry etching carried out in patterning the phase shift film 2. Thus, generation of step difference in the cross-sectional shape of the phase shift film 2 after patterning can be suppressed. The third layer 23 has more oxygen content of the surface layer portion opposite the second layer 22 than other portions. After forming the phase shift film 2 on the transparent substrate 1 with a film-forming apparatus, the film surface is subjected to a cleaning treatment. Since the surface layer portion of the third layer 23 is exposed to cleaning liquid and rinsing liquid in the cleaning treatment, advancement of oxidization is inevitable regardless of the composition upon film formation. Further, oxidization of the surface layer portion of the third layer 23 advances by exposure of the phase shift film 2 to the atmosphere and subjecting the phase shift film 2 to heat treatment in the atmosphere.

As mentioned above, a refractive index $n_3$ of the third layer 23 is required to be less than a refractive index $n_2$ of the second layer 22 ($n_2 > n_3$), and an extinction coefficient $k_3$ of the third layer 23 to be less than an extinction coefficient $k_2$ of the second layer 22 ($k_2 > k_3$). A refractive index n tends to decrease as an oxygen content of the material increases, and decreasing degree of an extinction coefficient k tends to increase compared to nitrogen. Therefore, the material forming the third layer 23 is preferably made of a material containing oxygen. An oxygen content of the material forming the third layer 23 is preferably 20 atom % or more, more preferably 25 atom % or more, and even more preferably 30 atom % or more. On the other hand, as an oxygen content of the third layer 23 increases, the thickness of the entire phase shift film 2 necessary to ensure predetermined transmittance and phase difference to an ArF exposure light in the entire phase shift film 2 increases. Considering these points, an oxygen content of the material forming the third layer 23 is preferably 60 atom % or less, more preferably 55 atom % or less, and even more preferably 50 atom % or less.

Further, it is preferable for a nitrogen content of the material forming the third layer 23 to be less than a nitrogen content of the material forming the second layer 22. Therefore, a nitrogen content of the material forming the third layer 23 is preferably 5 atom % or more, and more preferably 10 atom % or more. Further, a nitrogen content of the material forming the third layer 23 is preferably 40 atom % or less, more preferably 35 atom % or less, and even more preferably 30 atom % or less.

The third layer 23 has the minimum extinction coefficient k among the three layers forming the phase shift film 2, and further, has less refractive index n than the second layer 22. The third layer 23 being too thick causes an increase in the entire thickness of the phase shift film 2. Thus, the thickness of the third layer 23 is preferably 30 nm or less, more preferably 25 nm or less, and even more preferably 20 nm or less. If the third layer 23 is too thin, reflection of an exposure light is reduced at an interface between the second layer 22 and the third layer 23, which may cause reduction in a back surface reflectance of the phase shift film 2. Thus, thickness of the third layer 23 is preferably 5 nm or more, more preferably 10 nm or more, and even more preferably 15 nm or more.

While the first layer 21, the second layer 22, and the third layer 23 of the phase shift film 2 are formed through sputtering, any sputtering including DC sputtering, RF sputtering, ion beam sputtering, etc. is applicable. Application of DC sputtering is preferable, considering the film forming rate. In the case where the target has low conductivity, while application of RF sputtering and ion beam sputtering is preferable, application of RF sputtering is more preferable considering the film forming rate.

The mask blank 100 has a light shielding film 3 on the phase shift film 2. Generally, in a binary transfer mask, an outer peripheral region of a region where a transfer pattern is formed (transfer pattern forming region) is desired to ensure an optical density (OD) of a predetermined value or more to prevent the resist film from being subjected to an influence of an exposure light that transmitted through the outer peripheral region when an exposure-transfer was made on the resist film on a semiconductor wafer using an exposure apparatus. This point is similar in the case of a phase shift mask. Generally, the outer peripheral region of a transfer mask including a phase shift mask preferably has OD of 2.8 or more, and more preferably 3.0 or more. The phase shift film 2 has a function to transmit an exposure light at a predetermined transmittance, and it is difficult to ensure an optical density of a predetermined value with the phase shift film 2 alone. Therefore, it is necessary to stack the light shielding film 3 on the phase shift film 2 to secure lacking optical density at the stage of manufacturing the mask blank 100. With such a configuration of the mask blank 100, the phase shift mask 200 ensuring a predetermined value of optical density on the outer peripheral region can be manufactured by removing the light shielding film 3 of the region using the phase shifting effect (basically transfer pattern forming region) during manufacture of the phase shift mask 200 (see FIG. 2).

A single layer structure and a stacked structure of two or more layers are applicable to the light shielding film 3. Further, each layer in the light shielding film 3 of a single layer structure and the light shielding film 3 with a stacked structure of two or more layers may be configured by approximately the same composition in the thickness direction of the layer or the film, or with a composition gradient in the thickness direction of the layer.

The mask blank 100 of the embodiment shown in FIG. 1 is configured as a structure where the light shielding film 3 is stacked on the phase shift film 2 without an intervening film. For the light shielding film 3 in the case of this configuration, it is necessary to apply a material having sufficient etching selectivity to an etching gas used in forming a pattern in the phase shift film 2. The light shielding film 3 in this case is preferably made of a material containing chromium. Materials containing chromium for forming the light shielding film 3 can include, in addition to chromium metal, a material containing chromium and one or more elements selected from oxygen, nitrogen, carbon, boron, and fluorine.

While a chromium-based material is generally etched by a mixed gas of chlorine-based gas and oxygen gas, an etching rate of the chromium metal to the etching gas is not as high. Considering enhancing an etching rate of the mixed gas of chlorine-based gas and oxygen gas to etching gas, the material forming the light shielding film 3 preferably contains chromium and one or more elements selected from oxygen, nitrogen, carbon, boron, and fluorine. Further, one or more elements among molybdenum, indium, and tin can be included in the material containing chromium for forming the light shielding film 3. Including one or more elements among molybdenum, indium, and tin can increase an etching rate to the mixed gas of chlorine-based gas and oxygen gas.

The light shielding film 3 can be made of a material containing a transition metal and silicon, if an etching selectivity to dry etching can be obtained between the material forming the third layer 23 (esp., surface layer portion). This is because a material containing a transition metal and silicon has high light shielding performance, which enables reduction of thickness of the light shielding film 3. The transition metal to be included in the light shielding film 3 includes one metal among molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), palladium (Pd), etc., or an alloy of these metals. Metal elements other than the transition metal elements to be included in the light shielding film 3 include aluminum (Al), indium (In), tin (Sn), gallium (Ga), etc.

Incidentally, the light shielding film 3 made of two layers can have a structure where a layer consisting of a material containing chromium and a layer consisting of a material containing a transition metal and silicon are stacked, in this order, from the phase shift film 2 side. Concrete matters on the material containing chromium and the material containing a transition metal and silicon in this case are similar to the case of the light shielding film 3 described above.

It is preferable that the mask blank 100 in the state where the phase shift film 2 and the light shielding film 3 are stacked has 25% or more reflectance at the transparent substrate 1 side (back-surface side) to an ArF exposure light (back surface reflectance). In the case where the light shielding film 3 is made of a material containing chromium and in the case where the layer of the light shielding film 3 at the phase shift film 2 side is made of a material containing chromium, chromium is photoexcited so that chromium is likely to move to the phase shift film 2 side when a large amount of ArF exposure light enters the light shielding film 3. This movement of chromium can be suppressed by making the back surface reflectance to an ArF exposure light 25% or more in the state where the phase shift film 2 and the light shielding film 3 are stacked. Further, in the case where the light shielding film 3 is made of a material containing a transition metal and silicon, the transition metal is photoexcited so that the transition metal is likely to move to the phase shift film 2 side when a large amount of an ArF exposure light enters the light shielding film 3. The movement of the transition metal can be suppressed by making the back surface reflectance to an ArF exposure light 25% or more in the state where the phase shift film 2 and the light shielding film 3 are stacked.

In the mask blank 100, a preferable configuration is that the light shielding film 3 has further stacked thereon a hard mask film 4 made of a material having etching selectivity to an etching gas used in etching the light shielding film 3. Since the hard mask film 4 is basically not limited with regard to optical density, the thickness of the hard mask film 4 can be reduced significantly compared to the thickness of the light shielding film 3. Since a resist film of an organic material only requires a film thickness to function as an etching mask until dry etching for forming a pattern in the hard mask film 4 is completed, the thickness can be reduced significantly compared to conventional resist films. Reduction of film thickness of a resist film is effective for enhancing resist resolution and preventing collapse of pattern, which is extremely important in facing requirements for miniaturization.

In the case where the light shielding film 3 is made of a material containing chromium, the hard mask film 4 is preferably made of a material containing silicon. Since the hard mask film 4 in this case tends to have low adhesiveness with a resist film of an organic material, it is preferable to treat the surface of the hard mask film 4 with HMDS (Hexamethyldisilazane) to enhance surface adhesiveness. The hard mask film 4 in this case is more preferably made of $SiO_2$, SiN, SiON, etc.

Further, in the case where the light shielding film 3 is made of a material containing chromium, materials containing tantalum are also applicable as the materials of the hard mask film 4, in addition to the materials given above. The material containing tantalum in this case includes, in addition to tantalum metal, a material containing tantalum and one or more elements selected from nitrogen, oxygen, boron, and carbon, for example, Ta, TaN, TaO, TaON, TaBN, TaBO, TaBON, TaCN, TaCO, TaCON, TaBCN, and TaBOCN. Further, in the case where the light shielding film 3 is made of a material containing silicon, the hard mask film 4 is preferably made of the material containing chromium given above.

In the mask blank 100, a resist film of an organic material is preferably formed in contact with the surface of the hard mask film 4 at a resist film thickness of 100 nm or less. In the case of a fine pattern to meet DRAM hp32 nm generation, a SRAF (Sub-Resolution Assist Feature) with 40 nm line width may be provided on a transfer pattern (phase shift pattern) to be formed on the hard mask film 4. However, even in this case, the cross-sectional aspect ratio of the resist pattern can be reduced down to 1:2.5 so that collapse and peeling off of the resist pattern can be prevented in rinsing and developing, etc. of the resist film. Incidentally, the resist film preferably has a film thickness of 80 nm or less.

Second Embodiment

FIG. 2 is a cross-sectional view showing a configuration of a mask blank 100 of the second embodiment of this disclosure. The mask blank 100 shown in FIG. 2 differs from the mask blank 100 shown in FIG. 1 on the point of making the phase shift film 2 from a four layer structure having a fourth layer 24 stacked in addition to the first layer 21, the second layer 22, and the third layer 23, with a light shielding film 3 on the fourth layer 24. Explanation is arbitrarily omitted hereafter on the points that are common to the mask blank 100 of the first embodiment.

The phase shift film 2 of this embodiment is configured such that, as mentioned in the first embodiment, refractive indexes $n_1$, $n_2$, and $n_3$ of the first layer 21, the second layer 22, and the third layer 23, respectively, at the wavelength of an ArF exposure light satisfy the relations of $n_1<n_2$ and $n_2>n_3$; and extinction coefficients $k_1$, $k_2$, and $k_3$ of the first layer 21, the second layer 22, and the third layer 23, respectively, satisfy the relation of $k_1>k_2>k_3$. In addition, refractive indexes $n_1$, $n_3$, and $n_4$ of the first layer 21, the third layer 23, and the fourth layer 24, respectively, at the wavelength of an ArF exposure light satisfy the relations of $n_1<n_4$ and $n_3<n_4$; and extinction coefficients $k_1$, $k_3$, and $k_4$ of the first layer 21, the third layer 23, and the fourth layer 24, respectively, satisfy the relations of $k_1>k_4$ and $k_3<k_4$.

Further, a refractive index $n_4$ of the fourth layer 24 is preferably 2.3 or more, and more preferably 2.4 or more. Further, a refractive index $n_4$ of the fourth layer 24 is preferably 3.0 or less, and more preferably 2.8 or less. An extinction coefficient $k_4$ of the fourth layer 24 is preferably 0.5 or less, and more preferably 0.4 or less. Further, an extinction coefficient $k_4$ of the fourth layer 24 is preferably 0.16 or more, and more preferably 0.2 or more. Incidentally, a refractive index $n_4$ and an extinction coefficient $k_4$ of the fourth layer 24 are values derived by regarding the entire fourth layer 24 as a single, optically uniform layer.

The fourth layer 24 is preferably made of a material containing nitrogen. The fourth layer 24, excluding its surface layer portion, is more preferably made of a material consisting of silicon and nitrogen, or a material consisting of silicon, nitrogen, and one or more elements selected from non-metallic elements and metalloid elements excluding oxygen. Among the metalloid elements, it is preferable to include one or more elements selected from boron, germanium, antimony, and tellurium, since an enhancement in conductivity of silicon to be used as a sputtering target can be expected. The fourth layer 24 is the uppermost layer of the phase shift film 2. Therefore, the fourth layer 24 has more oxygen content of the surface layer portion opposite the third layer 23 than other portions, for the same reason as the case of the third layer 23 in the first embodiment. Incidentally, unlike the third layer 23 of the first embodiment, it may be possible for the surface layer portion of the third layer 23 of the second embodiment to be avoided from oxidization. Therefore, the third layer 23 of the second embodiment includes the case where oxidization of the surface layer portion is not advanced.

As mentioned above, a refractive index $n_4$ of the fourth layer 24 is required to be greater than refractive indexes $n_1$ and $n_3$ of the first layer 21 and the third layer 23 ($n_1<n_4$ and $n_3<n_4$), and an extinction coefficient $k_4$ of the fourth layer 24 to be less than an extinction coefficient $k_1$ of the first layer 21 and greater than an extinction coefficient $k_3$ of the third layer 23 ($k_1>k_4$ and $k_3<k_4$). Therefore, a nitrogen content of the material making the fourth layer 24 is preferably more than a nitrogen content of the material making the first layer 21 or the third layer 23, preferably 40 atom % or more, more preferably 45 atom % or more, and even more preferably 50 atom % or more. The nitrogen content of the material making the fourth layer 24 is preferably 57 atom % or less. Including a nitrogen content more than a nitrogen content of a stoichiometrically stable $Si_3N_4$ (about 57 atom %) causes easier escaping of nitrogen from the fourth layer 24 through mask cleaning and heat generating in the fourth layer 24 during dry etching, etc. so that a nitrogen content tends to be reduced.

The fourth layer 24 has an intermediate extinction coefficient k in the three layers forming the phase shift film 2. When the fourth layer 24 is too thick, it is necessary to reduce the thickness of the first layer in order to achieve a predetermined transmittance with the entire phase shift film 2, and thus, there is a risk that a back surface reflectance of the phase shift film 2 may be reduced. Thus, the thickness of the fourth layer 24 is preferably 45 nm or less, and more preferably 40 nm or less. Further, since the fourth layer 24 has the highest refractive index n among each layer forming the phase shift film 2, a certain degree or more thickness is required to increase a back surface reflectance of the phase shift film 2. Thus, the thickness of the fourth layer 24 is preferably 10 nm or more, and more preferably 15 nm or more.

It is preferable not to positively include oxygen in the fourth layer 24 excluding the surface layer portion (oxygen content through composition analysis of X-ray photoelectron spectroscopy, etc. is preferably 3 atom % or less, more preferably less than detection lower limit).

While the first layer 21, the second layer 22, the third layer 23, and the fourth layer 24 of the phase shift film 2 are formed through sputtering, any sputtering including DC sputtering, RF sputtering, ion beam sputtering, etc. is applicable. Application of DC sputtering is preferable, considering the film forming rate. In the case where the target has low conductivity, while application of RF sputtering and ion beam sputtering is preferable, application of RF sputtering is more preferable considering the film forming rate.

Incidentally, the configurations of the light shielding film 3 and the hard mask film 4 of the mask blank 100 in this embodiment are similar to the configurations of the light shielding film 3 and the hard mask film 4 of the mask blank 100 of the first embodiment.

Third Embodiment

The mask blank 100 according to the third embodiment of this disclosure differs from the mask blank 100 of the second embodiment in the configuration of the fourth layer 24. Explanation is arbitrarily omitted hereafter on the points that are common to the mask blank 100 of the second embodiment.

The phase shift film 2 of this embodiment is configured such that, as mentioned in the first embodiment, refractive indexes $n_1$, $n_2$, and $n_3$ of the first layer 21, the second layer 22, and the third layer 23, respectively, at the wavelength of an ArF exposure light satisfy the relations of $n_1 < n_2$ and $n_2 > n_3$; and extinction coefficients $k_1$, $k_2$, and $k_3$ of the first layer 21, the second layer 22, and the third layer 23, respectively, satisfy the relation of $k_1 > k_2 > k_3$. In addition, the phase shift film 2 of this embodiment is configured such that refractive indexes $n_1$, $n_3$, and $n_4$ of the first layer 21, the third layer 23, and the fourth layer 24, respectively, at the wavelength of an ArF exposure light satisfy the relations of $n_1 > n_4$ and $n_3 > n_4$; and extinction coefficients $k_3$ and $k_4$ of the third layer 23 and the fourth layer 24, respectively, satisfy the relation of $k_3 > k_4$ (i.e., extinction coefficient $k_4$ of the fourth layer 24 is the minimum among the first layer 21 to the fourth layer 24).

A refractive index $n_4$ of the fourth layer 24 in this embodiment is preferably 1.5 or more, and more preferably 1.55 or more. Further, a refractive index $n_4$ of the fourth layer 24 is preferably 1.8 or less, and more preferably 1.7 or less. An extinction coefficient $k_4$ of the fourth layer 24 is preferably 0.1 or less, and more preferably 0.05 or less. Further, an extinction coefficient $k_4$ of the fourth layer 24 is preferably 0.00 or more. Incidentally, a refractive index $n_4$ and an extinction coefficient $k_4$ of the fourth layer 24 are values derived by regarding the entire fourth layer 24 as a single, optically uniform layer.

The fourth layer 24 is preferably made of a material consisting of silicon and oxygen, or a material consisting of silicon, oxygen, and one or more elements selected from metalloid elements and non-metallic elements. Among these metalloid elements, it is preferable to include one or more elements selected from boron, germanium, antimony, and tellurium, since enhancement in conductivity of silicon to be used as a sputtering target can be expected. The non-metallic elements herein refer to those including non-metallic elements in a narrow sense (e.g., nitrogen, carbon, oxygen, phosphorus, sulfur, selenium), halogen, and noble gas. Among these non-metallic elements, it is preferable to include one or more elements selected from carbon, fluorine, and hydrogen. The fourth layer 24 can contain noble gas.

As mentioned above, a refractive index $n_4$ of the fourth layer 24 is required to be less than refractive indexes $n_1$ and $n_3$ of the first layer 21 and the third layer 23 ($n_1 > n_4$ and $n_3 > n_4$), and an extinction coefficient $k_4$ of the fourth layer 24 to be less than an extinction coefficient $k_3$ of the third layer 23 ($k_3 > k_4$). Therefore, it is preferable for an oxygen content of the material making the fourth layer 24 to be greater than an oxygen content of the material making the third layer 23. An oxygen content of the fourth layer 24 is preferably 50 atom % or more, more preferably 55 atom % or more, and even more preferably 60 atom % or more. The oxygen content of the fourth layer 24 is preferably 66 atom % or less. When the fourth layer 24 is rendered to include more oxygen than the mixing ratio of $SiO_2$, it will be difficult to form the fourth layer 24 into an amorphous structure or a microcrystalline structure. Further, surface roughness of the fourth layer 24 will significantly deteriorate.

On the other hand, the fourth layer 24 preferably has a nitrogen content of 10 atom % or less, more preferably 5 atom % or less, and it is further preferable not to positively include nitrogen (lower detection limit or less when composition analysis was conducted by X-ray photoelectron spectroscopy, etc.). High nitrogen content of the fourth layer 24 causes optical properties to change easily when subjected to repeated irradiation of an ArF exposure light, causing reduction in a function to protect the third layer 23 from oxygen in the air which will be mentioned below.

A silicon content of the fourth layer 24 is preferably 33 atom % or more, more preferably 35 atom % or more, and even more preferably 40 atom % or more. The fourth layer 24 is preferably made of a material consisting of silicon and oxygen. Incidentally, the material consisting of silicon and oxygen in this case can be regarded as including a material containing noble gas.

The fourth layer 24 has the minimum extinction coefficient k in the four layers making the phase shift film 2. When the fourth layer 24 is too thick, it is necessary to reduce the thickness of the first layer 21 in order to achieve a predetermined transmittance with the entire phase shift film 2, and thus, there is a risk that a back surface reflectance of the phase shift film 2 may be reduced. Thus, the thickness of the fourth layer 24 is preferably 15 nm or less, and more preferably 10 nm or less. Further, the thickness of the fourth layer 24 is preferably 1 nm or more, and more preferably 2 nm or more.

The phase shift film 2 of this embodiment is configured such that the third layer 23 has more oxygen content than the first layer 21 and the second layer 22, and the fourth layer 24 has more oxygen content than the third layer 23. Such a configuration enables the phase shift film 2 not to easily change optical properties when subjected to repeated irradiation of an ArF exposure light. Since an Si—O bond has higher stability in structure than an Si—N bond, optical properties of the fourth layer 24 and the third layer 23 do not change easily when subjected to repeated irradiation of an ArF exposure light. In addition, providing the fourth layer and the third layer 23 can suppress intrusion of oxygen in the air into the second layer 22 and the first layer 21.

Incidentally, the configurations of the light shielding film 3 and the hard mask film 4 of the mask blank 100 of this embodiment are similar to the configurations of the light shielding film 3 and the hard mask film 4 of the mask blank 100 of the first embodiment.

Figure 3B:
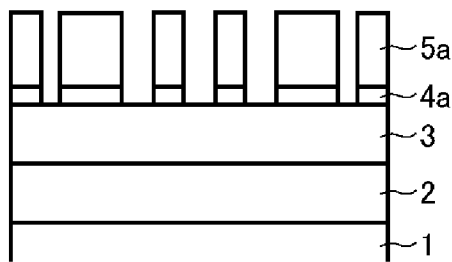
Figure 3F:
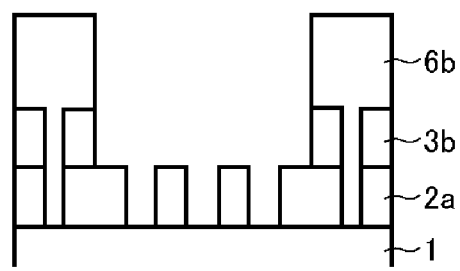
Figure 3C:
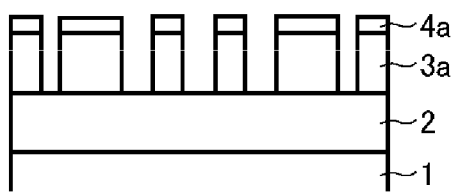
Figure 3G:
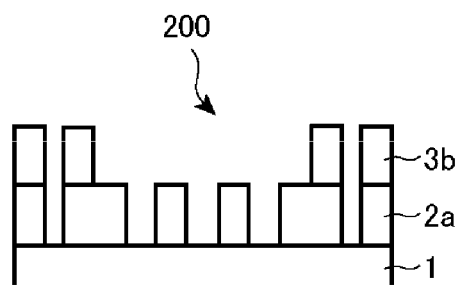
Figure 3D:
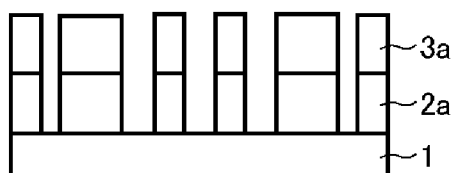

FIGS. 3A-3G show a phase shift mask 200 according to an embodiment of this disclosure manufactured from the mask blank 100 of the first, second, and third embodiments, and its manufacturing process. As shown in FIG. 3G, the phase shift mask 200 is featured in that a phase shift pattern 2a as a transfer pattern is formed in the phase shift film 2 of the mask blank 100, and a light shielding pattern 3b is formed in the light shielding film 3. In the case of a configuration where a hard mask film 4 is provided on the mask blank 100, the hard mask film 4 is removed during manufacture of the phase shift mask 200.

The method of manufacturing the phase shift mask of the embodiment of this disclosure uses the mask blank 100 mentioned above, which is featured in including forming a transfer pattern in the light shielding film 3 by dry etching; forming a transfer pattern in the phase shift film 2 by dry etching with the light shielding film 3 including the transfer pattern as a mask; and forming a light shielding pattern 3b in the light shielding film 3 by dry etching with a resist film (resist pattern 6b) including a light shielding pattern as a mask. The method of manufacturing the phase shift mask 200 of this disclosure is explained below according to the manufacturing steps shown in FIGS. 3A-3G. Explained herein is a method of manufacturing a phase shift mask 200 using a mask blank 100 having a hard mask film 4 stacked on a light shielding film 3. Further, a material containing chromium is applied to the light shielding film 3, and a material containing silicon is applied to the hard mask film 4 in this case.

First, a resist film is formed in contact with the hard mask film 4 of the mask blank 100 by spin coating. Next, a first pattern, which is a transfer pattern (phase shift pattern) to be formed in the phase shift film 2, was exposed and written with an electron beam in the resist film, and a predetermined treatment such as developing was conducted, to thereby form a first resist pattern 5a having a phase shift pattern (see FIG. 3A). Subsequently, dry etching was conducted using fluorine-based gas with the first resist pattern 5a as a mask, and a first pattern (hard mask pattern 4a) was formed in the hard mask film 4 (see FIG. 3B).

Next, after removing the resist pattern 5a, dry etching was conducted using a mixed gas of chlorine-based gas and oxygen gas with the hard mask pattern 4a as a mask, and a first pattern (light shielding pattern 3a) was formed in the light shielding film 3 (see FIG. 3C). Subsequently, dry etching was conducted using fluorine-based gas with the light shielding pattern 3a as a mask, and a first pattern (phase shift pattern 2a) was formed in the phase shift film 2, and at the same time, the hard mask pattern 4a was removed (see FIG. 3D).

Next, a resist film was formed on the mask blank 100 by spin coating. Next, a second pattern, which is a pattern (light shielding pattern) to be formed in the light shielding film 3, was exposed and written with an electron beam in the resist film, and a predetermined treatment such as developing was conducted, to thereby form a second resist pattern 6b having a light shielding pattern (see FIG. 3E). Subsequently, dry etching was conducted using a mixed gas of chlorine-based gas and oxygen gas with the second resist pattern 6b as a mask, and a second pattern (light shielding pattern 3b) was formed in the light shielding film 3 (see FIG. 3F). Further, the second resist pattern 6b was removed, predetermined treatments such as cleaning were carried out, and the phase shift mask 200 was obtained (see FIG. 3G).

There is no particular limitation on chlorine-based gas to be used for the dry etching described above, as long as Cl is included. The chlorine-based gas includes, for example, $Cl_2$, $SiCl_2$, $CHCl_3$, $CH_2Cl_2$, $CCl_4$, and $BCl_3$. Further, there is no particular limitation on fluorine-based gas to be used for the dry etching described above, as long as F is included. The fluorine-based gas includes, for example, $CHF_3$, $CF_4$, $C_2F_6$, $C_4F_3$, and $SF_6$. Particularly, fluorine-based gas free of C can further reduce damage on a glass substrate for having a relatively low etching rate to a glass substrate.

The phase shift mask 200 of this disclosure is manufactured using the mask blank 100 mentioned above. Therefore, the phase shift film 2 having a transfer pattern formed thereon (phase shift pattern 2a) has a transmittance of 15% or more to an ArF exposure light, and a phase difference between an exposure light transmitted through the phase shift pattern 2a and the exposure light that transmitted through the air for the same distance as the thickness of the phase shift pattern 2a of within the range of 150 degrees or more and 200 degrees or less, and in addition, an absorptivity Abs of an ArF exposure light is 55% or less. This phase shift mask 200 has 25% or more back surface reflectance in a region of the phase shift pattern 2a where the light shielding pattern 3b is not stacked (region on transparent substrate 1 where only phase shift pattern 2a exists). This can reduce the amount of an ArF exposure light entering inside of the phase shift film 2, and can reduce the amount of light that transforms into heat within the phase shift film 2 by emitting an ArF exposure light from the phase shift film 2 at an amount of light corresponding to the predetermined transmittance.

The phase shift mask 200 preferably has 45% or less back surface reflectance at a region of the phase shift pattern 2a where the light shielding pattern 3b is not stacked. This is for the purpose of preventing application of large influence on an exposure transfer image by reflected light of the back-surface side of the phase shift pattern 2a when the phase shift mask 200 was used to exposure-transfer an object to be transferred (resist film on semiconductor wafer, etc.).

The phase shift mask 200 preferably has 25% or more back surface reflectance at a region on the transparent substrate 1 of the phase shift pattern 2a where the light shielding pattern 3b is stacked. In the case where the light shielding pattern 3a is made of a material containing chromium or in the case where the layer at the phase shift pattern 2a side of the light shielding pattern 3a is made of a material containing chromium, movement of chromium in the light shielding pattern 3a into the phase shift pattern 2a can be suppressed. Further, in the case where the light shielding pattern 3a is made of a material containing a transition metal and silicon, movement of the transition metal in the light shielding pattern 3a into the phase shift pattern 2a can be suppressed.

The method of manufacturing a semiconductor device of this disclosure is featured in using the phase shift mask 200 given above and subjecting a resist film on a semiconductor substrate to exposure-transfer of a transfer pattern. The phase shift pattern 2a of the phase shift mask 200 has a high back surface reflectance to an ArF exposure light, and the amount of an ArF exposure light entering into the phase shift pattern 2a is reduced. Due to the above, the ratio of an ArF exposure light entering within the phase shift pattern 2a to be transformed into heat is reduced, and sufficiently suppresses the heat causing thermal expansion of the transparent substrate to displace the position of the phase shift pattern 2a. Therefore, even if the phase shift mask 200 was set on an exposure apparatus, and continuously irradiated with an ArF exposure light from the transparent substrate 1 side of the phase shift mask 200 and exposure-transferred to an object to be transferred (resist film on semiconductor wafer etc.), position precision of the phase shift pattern 2a is high so that a desired pattern can be transferred continuously to the object to be transferred at a high precision.

EXAMPLE

The embodiments of this disclosure are described in greater detail below together with examples.

Example 1

[Manufacture of Mask Blank]

A transparent substrate 1 made of a synthetic quartz glass with a size of a main surface of about 152 mm×about 152 mm and a thickness of about 6.35 mm was prepared. End surfaces and the main surface of the transparent substrate 1 were polished to a predetermined surface roughness, and thereafter subjected to predetermined cleaning treatment and drying treatment. The optical properties of the transparent substrate 1 were measured, and a refractive index n was 1.556 and an extinction coefficient k was 0.00 at the wavelength of the ArF exposure light.

Next, the transparent substrate 1 was placed in a single-wafer RF sputtering apparatus, and by RF sputtering using a silicon (Si) target with a mixed gas of argon (Ar) gas and nitrogen ($N_2$) as a sputtering gas, a first layer 21 of the phase shift film 2 consisting of silicon and nitrogen (SiN film Si:N=65 atom %:35 atom %) was formed in contact with a surface of the transparent substrate 1 at a thickness of 3.8 nm. Subsequently, by reactive sputtering (RF sputtering) using a silicon (Si) target with a mixed gas of krypton (Kr) and nitrogen ($N_2$) as a sputtering gas, a second layer 22 of the phase shift film 2 consisting of silicon and nitrogen ($Si_3N_4$ film Si:N=43 atom %:57 atom %) was formed on the first layer 21 at a thickness of 45.8 nm. Subsequently, by reactive sputtering (RF sputtering) using a mixed gas of argon (Ar), oxygen ($O_2$), and nitrogen ($N_2$) as a sputtering gas, a third layer 23 of the phase shift film 2 consisting of silicon, nitrogen, and oxygen (SiON film Si:O:N=40 atom %:30 atom %:30 atom %) was formed at a thickness of 19.0 nm. The composition of the first layer 21, the second layer 22, and the third layer 23 is the result obtained from measurement by X-ray photoelectron spectroscopy (XPS). The same applies to other films hereafter.

Next, the transparent substrate 1 having the phase shift film 2 formed thereon was subjected to heat treatment for reducing film stress of the phase shift film 2. A transmittance and a phase difference of the phase shift film 2 to a light of 193 nm wavelength were measured using a phase shift measurement apparatus (MPM193 manufactured by Lasertec), and a transmittance was 18.2% and a phase difference was 177.1 degrees. Moreover, each optical property was measured for the first layer 21, the second layer 22, and the third layer 23 of the phase shift film 2, and the first layer 21 had a refractive index $n_1$ of 1.65 and an extinction coefficient $k_1$ of 1.86; the second layer 22 had a refractive index $n_2$ of 2.61 and an extinction coefficient $k_2$ of 0.34; and the third layer 23 had a refractive index $n_3$ of 2.16 and an extinction coefficient $k_3$ of 0.12. A back surface reflectance (reflectance at transparent substrate 1 side) of the phase shift film 2 to the light of 193 nm wavelength was 27.8%, and an absorptivity of an ArF exposure light was 54.0%.

Thus, the phase shift film 2 of Example 1 is configured such that refractive indexes $n_1$, $n_2$, and $n_3$ of the first layer 21, the second layer 22, and the third layer 23, respectively, satisfy the two relations of $n_1<n_2$ and $n_2>n_3$; and extinction coefficients $k_1$, $k_2$, and $k_3$ of the first layer 21, the second layer 22, and the third layer 23, respectively, satisfy the relation of $k_1>k_2>k_3$. The phase shift film 2 of Example 1 has optical properties of a predetermined phase difference (150 degrees or more and 200 degrees or less) and 15% or more transmittance that are enough to obtain a sufficient phase shifting effect, and satisfies an absorptivity Abs of 55% or less.

Next, the transparent substrate 1 having the phase shift film 2 formed thereon was placed in a single-wafer DC sputtering apparatus, and by reactive sputtering (DC sputtering) using a chromium (Cr) target with a mixed gas of argon (Ar), carbon dioxide ($CO_2$), and helium (He) as a sputtering gas, a light shielding film 3 consisting of CrOC (CrOC film: Cr:O:C=56 atom %:27 atom %:17 atom %) was formed on the phase shift film 2 at a thickness of 56 nm. The optical density (OD) to a light of 193 nm wavelength in the stacked structure of the phase shift film 2 and the light shielding film 3 was 3.0 or more. Further, another transparent substrate 1 was prepared, only a light shielding film 3 was formed under the same film-forming conditions, the optical properties of the light shielding film 3 were measured, and a refractive index n was 1.95 and an extinction coefficient k was 1.42.

Next, the transparent substrate 1 with the phase shift film 2 and the light shielding film 3 stacked thereon was placed in a single-wafer RF sputtering apparatus, and by RF sputtering using a silicon dioxide ($SiO_2$) target with argon (Ar) gas as a sputtering gas, a hard mask film 4 consisting of silicon and oxygen was formed on the light shielding film 3 at a thickness of 12 nm. Through the above procedure, the mask blank 100 having a structure where the phase shift film 2 of a two-layer structure, the light shielding film 3, and the hard mask film 4 are stacked on the transparent substrate 1 was manufactured.

[Manufacture of Phase Shift Mask]

Next, a phase shift mask 200 of Example 1 was manufactured through the following procedure using the mask blank 100 of Example 1. First, a surface of the hard mask film 4 was subjected to HMDS treatment. Subsequently, a resist film of a chemically amplified resist for electron beam writing was formed in contact with a surface of the hard mask film 4 by spin coating at a film thickness of 80 nm. Next, a first pattern, which is a phase shift pattern to be formed in the phase shift film 2, was written by an electron beam on the resist film, predetermined cleaning and developing treatments were conducted, and a first resist pattern 5a having the first pattern was formed (see FIG. 3A).

Next, dry etching using $CF_4$ gas was conducted with the first resist pattern 5a as a mask, and a first pattern (hard mask pattern 4a) was formed in the hard mask film 4 (see FIG. 3B). Thereafter the first resist pattern 5a was removed.

Subsequently, dry etching was conducted using a mixed gas of chlorine and oxygen (gas flow ratio $Cl_2:O_2$=10:1) with the hard mask pattern 4a as a mask, and a first pattern (light shielding pattern 3a) was formed in the light shielding film 3 (see FIG. 3C). Next, dry etching was conducted using fluorine-based gas ($SF_6$+He) with the light shielding pattern 3a as a mask, and a first pattern (phase shift pattern 2a) was formed in the phase shift film 2, and at the same time the hard mask pattern 4a was removed (see FIG. 3D).

Next, a resist film of a chemically amplified resist for electron beam writing was formed on the light shielding pattern 3a by spin coating at a film thickness of 150 nm. Next, a second pattern, which is a pattern (light shielding pattern) to be formed in the light shielding film, was exposed and written in the resist film, further subjected to predetermined treatments such as developing, and a second resist pattern 6b having the light shielding pattern was formed (see FIG. 3E). Subsequently, dry etching was conducted using a mixed gas of chlorine and oxygen (gas flow ratio $Cl_2:O_2$=4:1) with the second resist pattern 6b as a mask, and a second pattern (light shielding pattern 3b) was formed in the light shielding film 3 (see FIG. 3F). Further, the second resist pattern 6b was removed, predetermined treatments such as cleaning were carried out, and the phase shift mask 200 was obtained (see FIG. 3G).

The manufactured half tone phase shift mask 200 of Example 1 was set on a mask stage of an exposure apparatus using an ArF excimer laser as an exposure light, an ArF exposure light was irradiated from the transparent substrate 1 side of the phase shift mask 200, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of in-plane position displacement from the design pattern was within a tolerable range. From the above result, it can be considered that a circuit pattern can be formed at a high precision on a semiconductor device with the resist pattern as a mask.

Example 2

[Manufacture of Mask Blank]

A mask blank 100 of Example 2 was manufactured through the same procedure as Example 1, except for the phase shift film 2. The changes in the phase shift film 2 of Example 2 are the film thickness of the first layer 21 and the second layer 22; the material making the third layer 23 and its film thickness; and the fourth layer 24 is stacked on the third layer 23. Concretely, a first layer 21 (SiN film) of the phase shift film 2 was formed in contact with a surface of the transparent substrate 1 at a film thickness of 2.7 nm, and a second layer 22 ($Si_3N_4$ film) was formed at a film thickness of 16 nm through the same procedure as Example 1. Subsequently, by reactive sputtering (RF sputtering) using a mixed gas of argon (Ar), oxygen ($O_2$), and nitrogen ($N_2$) as a sputtering gas, a third layer 23 of the phase shift film 2 consisting of silicon, nitrogen, and oxygen (SiON film Si:O:N=40 atom %:34 atom %:26 atom %) was formed at a thickness of 16.0 nm. Subsequently, by reactive sputtering (RF sputtering) using a silicon (Si) target with a mixed gas of argon (Ar) and nitrogen ($N_2$) as a sputtering gas, a fourth layer 24 of the phase shift film 2 consisting of silicon and nitrogen ($Si_3N_4$ film Si:N=43 atom %:57 atom %) was formed on the third layer 23 at a thickness of 34.0 nm.

Further, the phase shift film 2 of Example 2 was also subjected to heat treatment under the same treatment conditions as Example 1. A transmittance and a phase difference of the phase shift film 2 to a light of 193 nm wavelength were measured using a phase shift measurement apparatus (MPM193 manufactured by Lasertec), and a transmittance was 18.3% and a phase difference was 177.0 degrees. Moreover, each optical property was measured for the first layer 21, the second layer 22, the third layer 23, and the fourth layer 24 of the phase shift film 2, and the first layer 21 had a refractive index $n_1$ of 1.65 and an extinction coefficient $k_1$ of 1.86; the second layer 22 had a refractive index $n_2$ of 2.61 and an extinction coefficient $k_2$ of 0.34; the third layer 23 had a refractive index $n_3$ of 2.06 and an extinction coefficient $k_3$ of 0.07; and the fourth layer 24 had a refractive index $n_4$ of 2.61 and an extinction coefficient $k_4$ of 0.34. A back surface reflectance (reflectance at transparent substrate 1 side) of the phase shift film 2 to a light of 193 nm wavelength was 32.1%, and an absorptivity of an ArF exposure light was 49.6%.

Thus, the phase shift film 2 of Example 2 is configured such that refractive indexes $n_1$, $n_2$, and $n_3$ of the first layer 21, the second layer 22, and the third layer 23, respectively, satisfy the two relations of $n_1<n_2$ and $n_2>n_3$; and extinction coefficients $k_1$, $k_2$, and $k_3$ of the first layer 21, the second layer 22, and the third layer 23, respectively, satisfy the relation of $k_1>k_2>k_3$. Further, a refractive index $n_4$ of the fourth layer 24 at wavelength of an exposure light satisfies the relations of $n_1<n_4$ and $n_3<n_4$, and an extinction coefficient $k_4$ of the fourth layer 24 at wavelength of the exposure light satisfies the relations of $k_1>k_4$ and $k_3<k_4$. The phase shift film 2 of Example 2 has optical properties of a predetermined phase difference (150 degrees or more and 200 degrees or less) and 15% or more transmittance that are enough to obtain a sufficient phase shifting effect, and satisfies an absorptivity Abs of 55% or less.

Through the above procedure, the mask blank 100 of Example 2 was manufactured, the mask blank 100 having a structure in which the phase shift film 2 consisting of the first layer 21 of SiN film, the second layer 22 of $Si_3N_4$ film, the third layer 23 of SiON film, and the fourth layer 24 of $Si_3N_4$ film; the light shielding film 3; and the hard mask film 4 are stacked on the transparent substrate 1. The optical density (OD) to a light of 193 nm wavelength in the stacked structure of the phase shift film 2 and the light shielding film 3 was 3.0 or more.

[Manufacture of Phase Shift Mask]

Next, a phase shift mask 200 of Example 2 was manufactured through the same procedure as Example 1 using the mask blank 100 of Example 2.

The manufactured half tone phase shift mask 200 of Example 2 was set on a mask stage of an exposure apparatus using an ArF excimer laser as an exposure light, an ArF exposure light was irradiated from the transparent substrate 1 side of the phase shift mask 200, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of in-plane position displacement from the design pattern was within a tolerable range. From the above result, it can be considered that a circuit pattern can be formed at a high precision on a semiconductor device with the resist pattern as a mask.

Example 3

[Manufacture of Mask Blank]

A mask blank 100 of Example 3 was manufactured through the same procedure as Example 2, except for the phase shift film 2. The change in the phase shift film 2 of Example 3 compared to Example 2 is that the film thickness of the first layer 21 is 4.6 nm.

The phase shift film 2 of Example 3 was subjected to heat treatment under the same treatment conditions as Example 1. A transmittance and a phase difference of the phase shift film 2 to a light of 193 nm wavelength were measured using a phase shift measurement apparatus (MPM193 manufactured by Lasertec), and a transmittance was 15.6% and a phase difference was 179.0 degrees. Further, each optical property was measured for the first layer 21, the second layer 22, the third layer 23, and the fourth layer 24 of the phase shift film 2, and the first layer 21 had a refractive index $n_1$ of 1.65 and an extinction coefficient $k_1$ of 1.86; the second layer 22 had a refractive index $n_2$ of 2.61 and an extinction coefficient $k_2$ of 0.34; the third layer 23 had a refractive index $n_3$ of 2.06 and an extinction coefficient $k_3$ of 0.07; and the fourth layer 24 had a refractive index $n_4$ of 2.61 and an extinction coefficient $k_4$ of 0.34. A back surface reflectance (reflectance at transparent substrate 1 side) of the phase shift film 2 to a light of 193 nm wavelength was 36.0%, and an absorptivity of an ArF exposure light was 48.4%.

Thus, the phase shift film 2 of Example 3 is configured such that refractive indexes $n_1$, $n_2$, and $n_3$ of the first layer 21, the second layer 22, and the third layer 23, respectively, satisfy the two relations of $n_1 < n_2$ and $n_2 > n_3$; and extinction coefficients $k_1$, $k_2$, and $k_3$ of the first layer 21, the second layer 22, and the third layer 23, respectively, satisfy the relation of $k_1 > k_2 > k_3$. Further, a refractive index $n_4$ of the fourth layer 24 at wavelength of an exposure light satisfies the relations of $n_1 < n_4$ and $n_3 < n_4$, and an extinction coefficient $k_4$ of the fourth layer 24 at wavelength of the exposure light satisfies the relations of $k_1 > k_4$ and $k_3 < k_4$. The phase shift film 2 of Example 3 has optical properties of a predetermined phase difference (150 degrees or more and 200 degrees or less) and 15% or more transmittance that are enough to obtain a sufficient phase shifting effect, and satisfies an absorptivity Abs of 55% or less.

Through the above procedure, the mask blank 100 of Example 3 was manufactured, the mask blank 100 having a structure in which the phase shift film 2 consisting of the first layer 21 of SiN film, the second layer 22 of $Si_3N_4$ film, the third layer 23 of SiON film, and the fourth layer 24 of $Si_3N_4$ film; the light shielding film 3; and the hard mask film 4 are stacked on the transparent substrate 1. The optical density (OD) to a light of 193 nm wavelength in the stacked structure of the phase shift film 2 and the light shielding film 3 was 3.0 or more.

[Manufacture of Phase Shift Mask]

Next, a phase shift mask 200 of Example 3 was manufactured through the same procedure as Example 1 using the mask blank 100 of Example 3.

The manufactured half tone phase shift mask 200 of Example 3 was set on a mask stage of an exposure apparatus using an ArF excimer laser as an exposure light, an ArF exposure light was irradiated from the transparent substrate 1 side of the phase shift mask 200, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of in-plane position displacement from the design pattern was within a tolerable range. From the above result, it can be considered that a circuit pattern can be formed at a high precision on a semiconductor device with the resist pattern as a mask.

Example 4

[Manufacture of Mask Blank]

A mask blank 100 of Example 4 was manufactured through the same procedure as Example 2, except for the phase shift film 2. The change in the phase shift film 2 of Example 4 compared to Example 2 is the material of the first layer 21. Concretely, a transparent substrate 1 was placed in a single-wafer RF sputtering apparatus, and by reactive sputtering (DC sputtering) using a mixed target of molybdenum (Mo) and silicon (Si) (Mo:Si=13 atom %:87 atom %) and with a mixed gas of argon (Ar) and nitrogen ($N_2$) as a sputtering gas, a first layer 21 of the phase shift film 2 consisting of molybdenum, silicon, and nitrogen (MoSiN film Mo:Si:N=9 atom %:68 atom %:23 atom %) was formed in contact with a surface of the transparent substrate 1 at a thickness of 2.7 nm.

Further, the phase shift film 2 of Example 4 was subjected to heat treatment under the same treatment conditions as Example 1. A transmittance and a phase difference of the phase shift film 2 to a light of 193 nm wavelength were measured using a phase shift measurement apparatus (MPM193 manufactured by Lasertec), and a transmittance was 17.3% and a phase difference was 176.9 degrees. Moreover, each optical property was measured for the first layer 21, the second layer 22, the third layer 23, and the fourth layer 24 of the phase shift film 2, and the first layer 21 had a refractive index $n_1$ of 1.82 and an extinction coefficient $k_1$ of 2.20; the second layer 22 had a refractive index $n_2$ of 2.61 and an extinction coefficient $k_2$ of 0.34; the third layer 23 had a refractive index $n_3$ of 2.06 and an extinction coefficient $k_3$ of 0.07; and the fourth layer 24 had a refractive index $n_4$ of 2.61 and an extinction coefficient $k_4$ of 0.34. A back surface reflectance (reflectance at transparent substrate 1 side) of the phase shift film 2 to a light of 193 nm wavelength was 34.1%, and an absorptivity of an ArF exposure light was 48.6%.

Thus, the phase shift film 2 of Example 4 is configured such that refractive indexes $n_1$, $n_2$, and $n_3$ of the first layer 21, the second layer 22, and the third layer 23, respectively, satisfy the two relations of $n_1 < n_2$ and $n_2 > n_3$; and extinction coefficients $k_1$, $k_2$, and $k_3$ of the first layer 21, the second layer 22, and the third layer 23, respectively, satisfy the relation of $k_1 > k_2 > k_3$. Further, a refractive index $n_4$ of the fourth layer 24 at wavelength of an exposure light satisfies the relations of $n_1 < n_4$ and $n_3 < n_4$, and an extinction coefficient $k_4$ of the fourth layer 24 at wavelength of the exposure light satisfies the relations of $k_1 > k_4$ and $k_3 < k_4$. The phase shift film 2 of Example 4 has optical properties of a predetermined phase difference (150 degrees or more and 200 degrees or less) and 15% or more transmittance that are enough to obtain a sufficient phase shifting effect, and satisfies an absorptivity Abs of 55% or less.

Through the above procedure, the mask blank 100 of Example 4 was manufactured, the mask blank 100 having a structure in which the phase shift film 2 consisting of the first layer 21 of MoSi—N film, the second layer 22 of $Si_3N_4$ film, the third layer 23 of SiON film, and the fourth layer 24 of $Si_3N_4$ film; the light shielding film 3; and the hard mask film 4 are stacked on the transparent substrate 1. The optical density (OD) to a light of 193 nm wavelength in the stacked structure of the phase shift film 2 and the light shielding film 3 was 3.0 or more.

[Manufacture of Phase Shift Mask]

Next, a phase shift mask 200 of Example 4 was manufactured through the same procedure as Example 1 using the mask blank 100 of Example 4.

The manufactured half tone phase shift mask 200 of Example 4 was set on a mask stage of an exposure apparatus using an ArF excimer laser as an exposure light, an ArF exposure light was irradiated from the transparent substrate 1 side of the phase shift mask 200, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of in-plane position displacement from the design pattern was within a tolerable range. From the above result, it can be considered that a circuit pattern can be formed at a high precision on a semiconductor device with the resist pattern as a mask.

Example 5

[Manufacture of Mask Blank]

The mask blank 100 of Example 5 was manufactured through the same procedure as Example 2, except for the phase shift film 2. The changes in the phase shift film of Example 5 compared to Example 2 are the film thickness of each of the first layer 21 and the second layer 22, and the material making the third layer 23 and the fourth layer 24 and their film thickness.

Concretely, a first layer 21 (SiN film) of the phase shift film 2 was formed in contact with a surface of the transparent substrate 1 at a film thickness of 3 nm, and a second layer 22 ($Si_3N_4$ film) was formed at a film thickness of 18 nm through the same procedure as Example 2. Subsequently, by reactive sputtering (RF sputtering) using a mixed gas of argon (Ar), oxygen ($O_2$), and nitrogen ($N_2$) as a sputtering gas, a third layer 23 of the phase shift film 2 consisting of silicon, nitrogen, and oxygen (SiON film Si:O:N=44 atom %:27 atom %:29 atom %) was formed at a thickness of 56.0 nm. Further, by reactive sputtering (RF sputtering) using a silicon (Si) target with a mixed gas of argon (Ar) and oxygen ($O_2$) as a sputtering gas, a fourth layer 24 of the phase shift film 2 consisting of silicon and oxygen ($SiO_2$ film Si:O=34 atom %:66 atom %) was formed on the third layer 23 at a thickness of 3 nm.

The phase shift film 2 of Example 5 was subjected to heat treatment under the same treatment conditions as Example 1. A transmittance and a phase difference of the phase shift film 2 to a light of 193 nm wavelength were measured using a phase shift measurement apparatus (MPM193 manufactured by Lasertec), and a transmittance was 28% and a phase difference was 177 degrees. Further, each optical property was measured for the first layer 21, the second layer 22, the third layer 23, and the fourth layer 24 of the phase shift film 2, and the first layer 21 had a refractive index $n_1$ of 1.65 and an extinction coefficient $k_1$ of 1.86; the second layer 22 had a refractive index $n_2$ of 2.61 and an extinction coefficient $k_2$ of 0.34; the third layer 23 had a refractive index $n_3$ of 2.18 and an extinction coefficient $k_3$ of 0.12; and the fourth layer 24 had a refractive index $n_4$ of 1.56 and an extinction coefficient $k_4$ of 0.00. A back surface reflectance (reflectance at transparent substrate 1 side) of the phase shift film 2 to a light of 193 nm wavelength was 28%, and an absorptivity of an ArF exposure light was 44%.

Thus, the phase shift film 2 of Example 5 is configured such that refractive indexes $n_1$, $n_2$, and $n_3$ of the first layer 21, the second layer 22, and the third layer 23, respectively, satisfy the two relations of $n_1<n_2$ and $n_2>n_3$; and extinction coefficients $k_1$, $k_2$, and $k_3$ of the first layer 21, the second layer 22, and the third layer 23, respectively, satisfy the relation of $k_1>k_2>k_3$. Further, a refractive index $n_4$ of the fourth layer 24 at wavelength of an exposure light satisfies the relations of $n_1>n_4$ and $n_3>n_4$, and an extinction coefficient $k_4$ of the fourth layer 24 at a wavelength of the exposure light satisfies the relation of $k_3>k_4$. The phase shift film 2 of Example 5 has optical properties of a predetermined phase difference (150 degrees or more and 200 degrees or less) and 15% or more transmittance that are enough to obtain a sufficient phase shifting effect, and satisfies an absorptivity Abs of 55% or less.

Through the above procedure, the mask blank 100 of Example 5 was manufactured, the mask blank 100 having a structure in which the phase shift film 2 consisting of the first layer 21 of SiN film, the second layer 22 of $Si_3N_4$ film, the third layer 23 of SiON film, and the fourth layer 24 of $SiO_2$ film; the light shielding film 3; and the hard mask film 4 are stacked on the transparent substrate 1. The optical density (OD) to a light of 193 nm wavelength in the stacked structure of the phase shift film 2 and the light shielding film 3 was 3.0 or more.

[Manufacture of Phase Shift Mask]

Next, a phase shift mask 200 of Example 5 was manufactured through the same procedure as Example 1 using the mask blank 100 of Example 5.

The manufactured half tone phase shift mask 200 of Example 5 was set on a mask stage of an exposure apparatus using an ArF excimer laser as an exposure light, an ArF exposure light was irradiated from the transparent substrate 1 side of the phase shift mask 200, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of in-plane position displacement from the design pattern was within a tolerable range. From the above result, it can be considered that a circuit pattern can be formed at a high precision on a semiconductor device with the resist pattern as a mask.

REFERENCE EXAMPLE

[Manufacture of Mask Blank]

A mask blank of Reference Example was manufactured by the same procedure as Example 1, except for a phase shift film. The changes in the phase shift film of Reference Example are the materials making the first layer, the second layer, and the third layer, and their film thickness. Concretely, a transparent substrate was placed in a single-wafer RF sputtering apparatus, and by reactive sputtering (RF sputtering) using a silicon (Si) target with a mixed gas of krypton (Kr) and nitrogen ($N_2$) as a sputtering gas, a first layer of the phase shift film consisting of silicon and nitrogen ($Si_3N_4$ film Si:N=43 atom %:57 atom %) was formed in contact with a surface of the transparent substrate at a thickness of 20.7 nm. Subsequently, by reactive sputtering (RF sputtering) using a mixed gas of argon (Ar), oxygen ($O_2$), and nitrogen ($N_2$) as a sputtering gas, a second layer of the phase shift film consisting of silicon, nitrogen, and oxygen (SiON film Si:O:N=40 atom %:38 atom %:22 atom %) was formed on the first layer at a thickness of 19.0 nm. Subsequently, by reactive sputtering (RF sputtering) using a silicon (Si) target with a mixed gas of argon (Ar) and nitrogen ($N_2$) as a sputtering gas, a third layer of the phase shift film consisting of silicon and nitrogen ($Si_3N_4$ film Si:N=43 atom %:57 atom %) was formed on the second layer at a thickness of 31.1 nm.

Further, the phase shift film of Reference Example was subjected to heat treatment under the same treatment conditions as Example 1. A transmittance and a phase difference of the phase shift film to a light of 193 nm wavelength were measured using a phase shift measurement apparatus (MPM193 manufactured by Lasertec), and a transmittance was 20.7% and a phase difference was 177.0 degrees. Moreover, each optical property was measured for the first layer, the second layer, and the third layer of the phase shift film, and the first layer had a refractive index $n_1$ of 2.61 and an extinction coefficient $k_1$ of 0.36; the second layer had a refractive index $n_2$ of 1.90 and an extinction coefficient $k_2$ of 0.035; and the third layer had a refractive index $n_3$ of 2.61 and an extinction coefficient $k_3$ of 0.34. A back surface reflectance (reflectance at transparent substrate 1 side) of the phase shift film to a light of 193 nm wavelength was 29.7%, and an absorptivity of an ArF exposure light was 49.6%.

Thus, refractive indexes $n_1$, $n_2$, and $n_3$ of the first layer, the second layer, and the third layer, respectively, of the phase shift film of Reference Example do not satisfy the two relations of $n_1<n_2$ and $n_2>n_3$; and extinction coefficients $k_1$, $k_2$, and $k_3$ of the first layer, the second layer, and the third layer, respectively, do not satisfy the relation of $k_1>k_2>k_3$. However, the phase shift film of Reference Example has optical properties of a predetermined phase difference (150 degrees or more and 200 degrees or less) and 15% or more transmittance that are enough to obtain a sufficient phase shifting effect, and satisfies an absorptivity Abs of 55% or less.

Through the above procedure, the mask blank of Reference Example was manufactured, the mask blank having a structure in which the phase shift film consisting of the first layer of $Si_3N_4$ film, the second layer of SiON film, and the third layer of $Si_3N_4$ film; the light shielding film; and the hard mask film are stacked on the transparent substrate. The optical density (OD) to a light of 193 nm wavelength in the stacked structure of the phase shift film and the light shielding film was 3.0 or more.

[Manufacture of Phase Shift Mask]

Next, a phase shift mask of Reference Example was manufactured through the same procedure as Example 1 using the mask blank of Reference Example.

The manufactured half tone phase shift mask of Reference Example was set on a mask stage of an exposure apparatus using an ArF excimer laser as an exposure light, an ArF exposure light was irradiated from the transparent substrate side of the phase shift mask, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of in-plane position displacement from the design pattern was within a tolerable range. From the above result, it can be considered that a circuit pattern can be formed at a high precision on a semiconductor device with the resist pattern as a mask.

Comparative Example 1

[Manufacture of Mask Blank]

A mask blank of Comparative Example 1 was manufactured by the same procedure as Example 1, except for the phase shift film. The phase shift film of Comparative Example 1 is changed to a single layer structure. Concretely, a transparent substrate was placed in a single-wafer RF sputtering apparatus, and by reactive sputtering (RF sputtering) using a silicon (Si) target with a mixed gas of argon (Ar) and nitrogen ($N_2$) as a sputtering gas, a layer of a phase shift film consisting of silicon and nitrogen ($Si_3N_4$ film Si:N=43 atom %:57 atom %) was formed in contact with a surface of the transparent substrate at a thickness of 60.5 nm.

Further, the phase shift film of Comparative Example 1 was subjected to heat treatment under the same treatment conditions as Example 1. A transmittance and a phase difference of the phase shift film to a light of 193 nm wavelength were measured using a phase shift measurement apparatus (MPM193 manufactured by Lasertec), and a transmittance was 18.8% and a phase difference was 177.0 degrees. Moreover, the optical properties of the phase shift film were measured, and a refractive index n was 2.61 and an extinction coefficient k was 0.36. A back surface reflectance (reflectance at transparent substrate side) of the phase shift film to a light of 193 nm wavelength was 19.5%, and an absorptivity of an ArF exposure light was 61.7%.

Thus, although the phase shift film of Comparative Example 1 has optical properties of a predetermined phase difference (150 degrees or more and 200 degrees or less) and 15% or more transmittance that are enough to obtain a sufficient phase shifting effect, an absorptivity Abs of 55% or less is not satisfied.

Through the above procedures, the mask blank of Comparative Example 1 having a structure where a phase shift film, a light shielding film, and a hard mask film are stacked on the transparent substrate was manufactured. The optical density (OD) to a light of 193 nm wavelength in the stacked structure of the phase shift film and the light shielding film was 3.0 or more.

[Manufacture of Phase Shift Mask]

Next, using the mask blank of Comparative Example 1, a phase shift mask of Comparative Example 1 was manufactured through the same procedure as Example 1.

The manufactured half tone phase shift mask of Comparative Example 1 was set on a mask stage of an exposure apparatus using an ArF excimer laser as an exposure light, an ArF exposure light was irradiated from the transparent substrate side of the phase shift mask, and a pattern was exposure-transferred in a resist film on a semiconductor device. The resist film after the exposure transfer was subjected to predetermined treatments to form a resist pattern, and the resist pattern was observed using SEM (Scanning Electron Microscope). As a result, the amount of position displacement from the design pattern was significant, and several portions out of tolerable range were found. From this result, generation of short-circuit or disconnection is expected on a circuit pattern to be formed in the semiconductor device using the resist pattern as a mask.

Comparative Example 2

[Manufacture of Mask Blank]

A mask blank of Comparative Example 2 was manufactured by the same procedure as Example 1, except for a phase shift film. The phase shift film of Comparative Example 2 is changed to a two layer structure. Concretely, a transparent substrate was placed in a single-wafer RF sputtering apparatus, and by reactive sputtering (RF sputtering) using a silicon (Si) target with a mixed gas of krypton (Kr) and nitrogen ($N_2$) as a sputtering gas, a first layer of the phase shift film consisting of silicon and nitrogen (Si:N=65 atom %:35 atom %) was formed in contact with a surface of the transparent substrate at a thickness of 2.0 nm. Subsequently, by reactive sputtering (RF sputtering) using a silicon (Si) target with a mixed gas of argon (Ar) and nitrogen ($N_2$) as a sputtering gas, a second layer of the phase shift film consisting of silicon and nitrogen ($Si_3N_4$ film Si:N=43 atom %:57 atom %) was formed on the first layer at a thickness of 60.1 nm.

Further, the phase shift film of Comparative Example 2 was subjected to heat treatment under the same treatment conditions as Example 1. A transmittance and a phase difference of the phase shift film to a light of 193 nm wavelength were measured using a phase shift measurement apparatus (MPM193 manufactured by Lasertec), and a transmittance was 15.6% and a phase difference was 177.0 degrees. Moreover, each optical property was measured for the first layer and the second layer of the phase shift film, and the first layer had a refractive index n of 1.65 and an extinction coefficient k of 1.86, and the second layer had a refractive index n of 2.61 and an extinction coefficient k of 0.34. A back surface reflectance (reflectance at transparent substrate side) of the phase shift film to a light of 193 nm wavelength was 24.6%, and an absorptivity of an ArF exposure light was 59.8%.

Thus, although the phase shift film of Comparative Example 2 has optical properties of a predetermined phase difference (150 degrees or more and 200 degrees or less) and 15% or more transmittance that are enough to obtain a sufficient phase shifting effect, an absorptivity Abs of 55% or less is not satisfied.

Through the above procedures, the mask blank of Comparative Example 2 having a structure where the phase shift film, the light shielding film, and the hard mask film are stacked on the transparent substrate was manufactured. The optical density (OD) to a light of 193 nm wavelength in the stacked structure of the phase shift film and the light shielding film was 3.0 or more.

[Manufacture of Phase Shift Mask]

Next, a phase shift mask of Comparative Example 2 was manufactured through the same procedure as Example 1 using the mask blank of Comparative Example 2.

The manufactured half tone phase shift mask of Comparative Example 2 was set on a mask stage of an exposure apparatus using an ArF excimer laser as an exposure light, an ArF exposure light was irradiated from the transparent substrate side of the phase shift mask, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of position displacement from the design pattern was significant, and several portions out of tolerable range were found. From this result, generation of short-circuit or disconnection is expected on a circuit pattern to be formed in the semiconductor device using the resist pattern as a mask.

Comparative Example 3

[Manufacture of Mask Blank]

A mask blank of Comparative Example 3 was manufactured by the same procedure as Example 1, except for a phase shift film. The phase shift film of Comparative Example 3 is changed to a two layer structure. Concretely, a transparent substrate was placed in a single-wafer RF sputtering apparatus, and by reactive sputtering (RF sputtering) using a silicon (Si) target with a mixed gas of argon (Ar) and nitrogen ($N_2$) as a sputtering gas, a first layer of the phase shift film consisting of silicon and nitrogen (Si:N=50 atom %:50 atom %) was formed in contact with a surface of the transparent substrate at a thickness of 45.0 nm. Subsequently, by reactive sputtering (RF sputtering) using a silicon (Si) target with a mixed gas of argon (Ar), oxygen ($O_2$), and nitrogen ($N_2$) as a sputtering gas, a second layer of the phase shift film consisting of silicon, nitrogen, and oxygen (SiON film Si:O:N=40 atom %:20 atom %:40 atom %) was formed on the first layer at a thickness of 21.0 nm.

Further, the phase shift film of Comparative Example 3 was subjected to heat treatment under the same treatment conditions as Example 1. A transmittance and a phase difference of the phase shift film to a light of 193 nm wavelength were measured using a phase shift measurement apparatus (MPM193 manufactured by Lasertec), and a transmittance was 30% and a phase difference was 171 degrees. Moreover, each optical property was measured for the first layer and the second layer of the phase shift film, and the first layer had a refractive index n of 2.6 and an extinction coefficient k of 0.34, and the second layer had a refractive index n of 2.0 and an extinction coefficient k of 0.08. A back surface reflectance (reflectance at transparent substrate side) of the phase shift film to a light of 193 nm wavelength was 19.0%, and an absorptivity of an ArF exposure light was 61.0%.

Thus, although the phase shift film of Comparative Example 3 has optical properties of a predetermined phase difference (150 degrees or more and 200 degrees or less) and 15% or more transmittance that are enough to obtain a sufficient phase shifting effect, an absorptivity Abs of 55% or less is not satisfied.

Through the above procedures, the mask blank of Comparative Example 3 having a structure where the phase shift film, the light shielding film, and the hard mask film are stacked on the transparent substrate was manufactured. The optical density (OD) to a light of 193 nm wavelength in the stacked structure of the phase shift film and the light shielding film was 3.0 or more.

[Manufacture of Phase Shift Mask]

Next, a phase shift mask of Comparative Example 3 was manufactured through the same procedure as Example 1 using the mask blank of Comparative Example 3.

The manufactured half tone phase shift mask of Comparative Example 3 was set on a mask stage of an exposure apparatus using an ArF excimer laser as an exposure light, an ArF exposure light was irradiated from the transparent substrate side of the phase shift mask, and a pattern was exposure-transferred in a resist film on a semiconductor device. The resist film after the exposure transfer was subjected to predetermined treatments to form a resist pattern, and the resist pattern was observed using an SEM (Scanning Electron Microscope). As a result, the amount of position displacement from the design pattern was significant, and several portions out of tolerable range were found. From this result, generation of short-circuit or disconnection is expected on a circuit pattern to be formed in the semiconductor device using the resist pattern as a mask.

DESCRIPTION OF REFERENCE NUMERALS 1 transparent substrate
2 phase shift film
21 first layer
22 second layer
23 third layer
24 fourth layer
2a phase shift pattern
3 light shielding film
3a, 3b light shielding pattern
4 hard mask film
4a hard mask pattern
5a first resist pattern
6b second resist pattern
100 mask blank
200 phase shift mask

The invention claimed is:

1. A mask blank comprising:
a transparent substrate; and
a phase shift film on the transparent substrate,
wherein the phase shift film contains silicon,
wherein the phase shift film has a first layer, a second layer, and a third layer,
wherein, among the first layer, the second layer, and the third layer, the first layer is closest to the transparent substrate and the third layer is farthest from the transparent substrate,
wherein refractive indexes $n_1$, $n_2$, and $n_3$ of the first layer, the second layer, and the third layer, respectively, at a wavelength of an exposure light of an ArF excimer laser satisfy relations of $n_1<n_2$ and $n_2>n_3$, and wherein extinction coefficients $k_1$, $k_2$, and $k_3$ of the first layer, the second layer, and the third layer, respectively, at a wavelength of the exposure light satisfy a relation of $k_1>k_2>k_3$.

2. The mask blank according to claim 1, wherein the first layer has the refractive index $n_1$ of less than 2.0, and the extinction coefficient $k_1$ of 1.0 or more.

3. The mask blank according to claim 1, wherein the first layer has a thickness of 10 nm or less.

4. The mask blank according to claim 1, wherein the second layer has the refractive index $n_2$ of 2.3 or more and the extinction coefficient $k_2$ of 0.5 or less.

5. The mask blank according to claim 1, wherein the third layer has the refractive index $n_3$ of less than 2.3 and the extinction coefficient $k_3$ of 0.15 or less.

6. The mask blank according to claim 1, wherein the phase shift film consists of:
silicon;
one or more elements from the group consisting of nitrogen, carbon, oxygen, phosphorus, sulfur, selenium, halogens, and noble gases; and
optionally, one element from the group consisting of boron, germanium, antimony, and tellurium.

7. The mask blank according to claim 1, wherein the first, the second, and the third layers all contain nitrogen.

8. The mask blank according to claim 1, wherein the third layer contains oxygen.

9. The mask blank according to claim 1, wherein the phase shift film comprises a fourth layer on the third layer,
wherein a refractive index $n_4$ of the fourth layer at a wavelength of the exposure light satisfies relations of $n_1<n_4$ and $n_3<n_4$, and
wherein an extinction coefficient $k_4$ of the fourth layer at an wavelength of the exposure light satisfies relations of $k_1>k_4$ and $k_3<k_4$.

10. The mask blank according to claim 9, wherein the refractive index $n_4$ of the fourth layer is 2.3 or more and the extinction coefficient $k_4$ is 0.5 or less.

11. The mask blank according to claim 9, wherein the fourth layer contains nitrogen.

12. The mask blank according to claim 1 comprising a light shielding film on the phase shift film.

13. The mask blank according to claim 1,
wherein a transmittance of the phase shift film with respect to an exposure light of an ArF excimer laser is 15% or more,
wherein the phase shift film is configured to transmit the exposure light such that the transmitted light has a phase difference of 150 degrees or more and 200 degrees or less with respect to the exposure light transmitted through air for a same distance as a thickness of the phase shift film.

14. A phase shift mask comprising:
a transparent substrate; and
a phase shift film having a transfer pattern on the transparent substrate,
wherein the phase shift film contains silicon,
wherein the phase shift film has a first layer, a second layer, and a third layer,
wherein, among the first layer, the second layer, and the third layer, the first layer is closest to the transparent substrate and the third layer is farthest from the transparent substrate, wherein refractive indexes $n_1$, $n_2$, and $n_3$ of the first layer, the second layer, and the third layer, respectively, at a wavelength of an exposure light of an ArF excimer laser satisfy relations of $n_1<n_2$ and $n_2>n_3$, and wherein extinction coefficients $k_1$, $k_2$, and $k_3$ of the first layer, the second layer, and the third layer, respectively, at a wavelength of the exposure light satisfy a relation of $k_1>k_2>k_3$.

15. The phase shift mask according to claim 14, wherein the first layer has the refractive index $n_1$ of less than 2.0 and the extinction coefficient $k_1$ of 1.0 or more.

16. The phase shift mask according to claim 14, wherein the first layer has a thickness of 10 nm or less.

17. The phase shift mask according to claim 14, wherein the second layer has the refractive index $n_2$ of 2.3 or more and the extinction coefficient $k_2$ of 0.5 or less.

18. The phase shift mask according to claim 14, wherein the third layer has the refractive index $n_3$ of less than 2.3 and the extinction coefficient $k_3$ of 0.15 or less.

19. The phase shift mask according to claim 14, wherein the phase shift film consists of:
silicon;
one or more elements from the group consisting of nitrogen, carbon, oxygen, phosphorus, sulfur, selenium, halogens, and noble gases; and
optionally, one element from the group consisting of boron, germanium, antimony, and tellurium.

20. The phase shift mask according to claim 14, wherein the first, the second, and the third layers all contain nitrogen.

21. The phase shift mask according to claim 14, wherein the third layer contains oxygen.

22. The phase shift mask according to claim 14, wherein the phase shift film comprises a fourth layer on the third layer,
wherein a refractive index $n_4$ of the fourth layer at a wavelength of the exposure light satisfies relations of $n_1<n_4$ and $n_3<n_4$, and
wherein an extinction coefficient $k_4$ of the fourth layer at an wavelength of the exposure light satisfies relations of $k_1>k_4$ and $k_3<k_4$.

23. The phase shift mask according to claim 22, wherein the fourth layer has the refractive index $n_4$ of 2.3 or more and the extinction coefficient $k_4$ of 0.5 or less.

24. The phase shift mask according to claim 22, wherein the fourth layer contains nitrogen.

25. The phase shift mask according to claim 14 comprising a light shielding film that has a pattern including a light shielding band and is on the phase shift film.

26. The phase shift mask according to claim 14,
wherein a transmittance of the phase shift film with respect to an exposure light of an ArF excimer laser is 15% or more,
wherein the phase shift film is configured to transmit the exposure light such that the transmitted light has a phase difference of 150 degrees or more and 200 degrees or less with respect to the exposure light transmitted through air for a same distance as a thickness of the phase shift film.

27. A method of manufacturing a semiconductor device comprising subjecting a resist film on a semiconductor substrate to exposure-transfer of a transfer pattern, using the phase shift mask according to claim 25.

* * * * *